United States Patent [19]

Kyuragi et al.

[11] Patent Number: 4,557,036
[45] Date of Patent: Dec. 10, 1985

[54] SEMICONDUCTOR DEVICE AND PROCESS FOR MANUFACTURING THE SAME

[75] Inventors: Hakaru Kyuragi, Tokorozawa; Hideo Oikawa, Koganei, both of Japan

[73] Assignee: Nippon Telegraph & Telephone Public Corp., Tokyo, Japan

[21] Appl. No.: 479,135

[22] Filed: Mar. 25, 1983

[30] Foreign Application Priority Data

Mar. 31, 1982 [JP] Japan .................................. 57-51382
Mar. 31, 1982 [JP] Japan .................................. 57-51383

[51] Int. Cl.$^4$ .......................................... H01L 21/28
[52] U.S. Cl. ...................................... 29/571; 29/578; 29/591; 148/1.5; 148/DIG. 103; 148/DIG. 105; 357/67; 427/88; 427/43
[58] Field of Search ............. 29/571, 578, 591, 576 B; 148/1.5, DIG. 20, DIG. 105, DIG. 103, DIG. 117; 357/67, 33, 23, 65; 427/93, 88, 95

[56] References Cited

U.S. PATENT DOCUMENTS

| | | | |
|---|---|---|---|
| 3,566,517 | 3/1971 | Brown et al. | 148/187 X |
| 3,614,829 | 10/1971 | Burgess et al. | 148/188 X |
| 3,679,492 | 7/1972 | Fang et al. | 29/571 X |
| 3,966,501 | 6/1976 | Nomura et al. | 148/187 X |
| 3,967,981 | 7/1976 | Yamazaki | 148/187 X |
| 4,149,307 | 4/1979 | Henderson | 29/571 |

OTHER PUBLICATIONS

Yanagawa et al., Mo–Gate MOS Metallization System Japanese Journal of Applied Physics, vol. 18 (1979), Supplement 18-1, pp. 237–245.
F. Faggin & T. Klein, Silicon Gate Technology, Solid–State Electronics 1970, vol. 13, pp. 1125–1144.

*Primary Examiner*—Brian E. Hearn
*Assistant Examiner*—David A. Hey
*Attorney, Agent, or Firm*—Cushman, Darby & Cushman

[57] ABSTRACT

A multilayer structure comprising a Si layer/ a refractory metal oxide layer/ a refractory metal layer/ is subjected to annealing in an atmosphere of hydrogen or an inert gas mixed with hydrogen, thereby converting the multilayer structure into a multilayer structure comprising a Si layer/an inner $SiO_2$ layer formed by internal oxidation of Si/a refractory metal layer. The inner $SiO_2$ layer is selectively formed only on the surface of the refractory metal layer, since Si is internally oxidized from the side of the refractory metal layer. In case of gate electrode of a MISFET, the gate electrode and a contact hole for source or drain electrode are positioned in self-alignment with each other via the inner $SiO_2$ layer. The distance between the gate electrode and the source or drain electrode is determined by the thickness of the inner $SiO_2$ layer. A semiconductor device with a high density and a high speed is realized.

8 Claims, 63 Drawing Figures

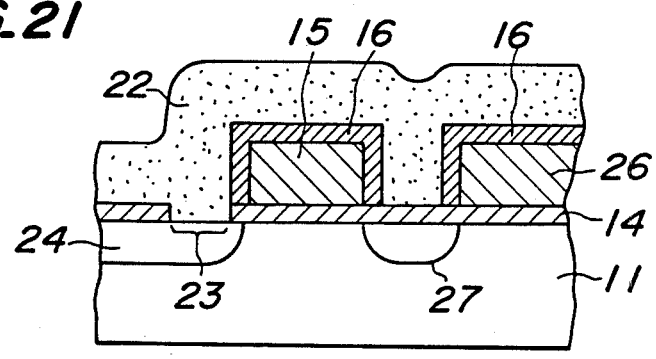
FIG_21
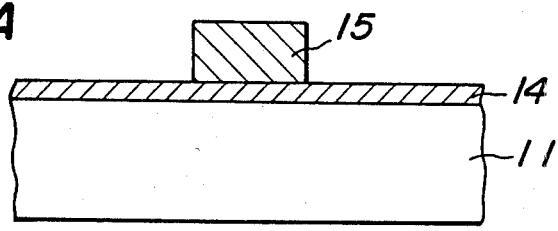
FIG_22A
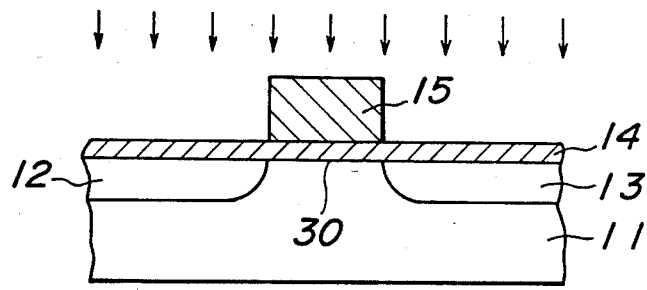
FIG_22B
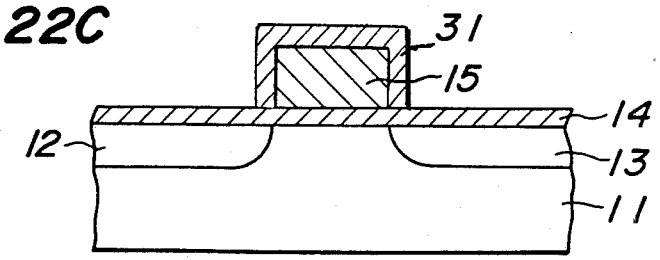
FIG_22C

FIG_24A
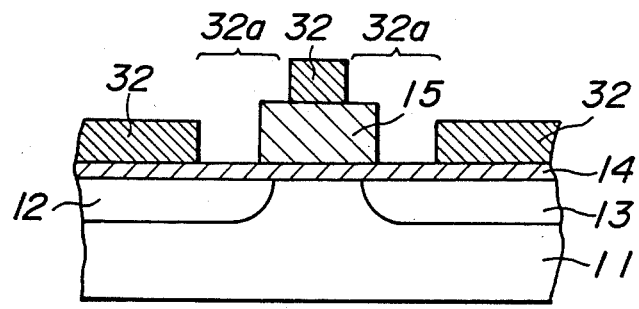
FIG_24B
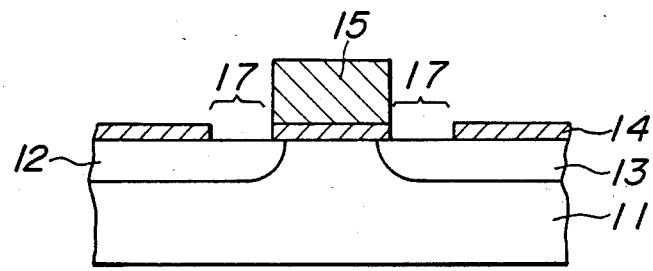
FIG_24C
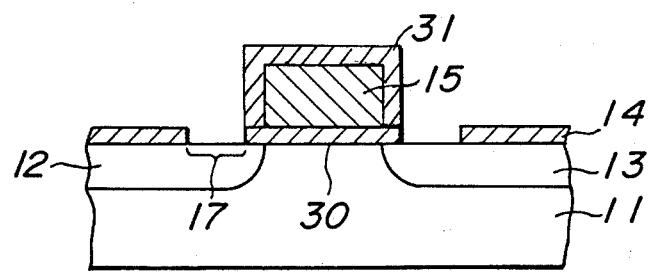

ced as "CVD") method or the like (SiO$_2$ film deposited by

SEMICONDUCTOR DEVICE AND PROCESS FOR MANUFACTURING THE SAME

BACKGROUND OF THE INVENTION

1. Field of the Invention

The present invention relates to a semiconductor device, particularly to a semiconductor device using refractory metal as electrodes or the like, and to a process for manufacturing the same.

2. Prior Art of the Invention

In conventional semiconductor devices, use are made of, as materials of electrodes, wirings or the like, metal having a low melting point, such as aluminum (hereinafter referred to as "Al"), refractory metal such as molybdenum (hereinafter referred to as "Mo", tungsten (hereinafter referred to as "W"), tantalum hereinafter referred to as "Ta") or titanium (hereinafter referred to as "Ti"), or semiconductor materials such as polycrystalline silicon (hereinafter abbreviated as "poly Si").

For example, a semiconductor device using Mo is disclosed by Fumihiko Yanagawa et al., "(Invited) Mo-gate MOS metallization System", Proceedings of the 10th Conference on Solid State Devices, Tokyo, 1978; Japanese Journal of Applied Physics, Volume 18 (1979) Supplement 18-1, pp. 237-245.

Each of the above-mentioned materials has some advantages and disadvantages. Al has an advantage of having a low resistivity, but a disadvantage of having a low melting point of 660° C., which imposes various restraints on the semiconductor device fabrication process including the step of annealing, which is usually required to be effected at about 1,000° C.

Poly Si has advantages of the capability of resisting annealing at about 1,000° C. and of having a good affinity to silicon used as a substrate, both of which give wide freedom in designing the semiconductor device fabrication process. Furthermore, poly Si advantageously forms a silicon dioxide (hereinafter referred to as "SiO$_2$") film having a good electrical insulating quality on its surface easily by merely processing annealing in an oxidating atmosphere. Poly Si and SiO$_2$ are both resistible to acid washing with an adequate mixed liquid of H$_2$SO$_4$, HCl, HNO$_3$, H$_2$O$_2$ and so on (hereinafter simply referred to as "acid washing"). Therefore, an element surface can easily be cleaned. In view of the above, the use of poly Si as the material of electrodes, wirings and so on advantageously leads to a high yield in the semiconductor device fabrication. The resistivity of poly Si, however, is higher by the order of two or three figures than those of metals. This leads to an increase in propagation delay due to wiring resistance in a semiconductor device using poly Si as the material of electrodes, wirings and so on. Thus, difficulties have been encountered in realizing a high integration and high speed semiconductor device.

On the other hand, a refractory metal, e.g., Mo with a melting point of about 2,600° C., is resistible to annealing at about 1,000° C. Therefore, the use of a refractory metal like Mo as the material of electrodes, wirings and so on provides wide freedom in designing the semiconductor device fabrication process. Moreover, such refractory metals are low in resistivity, and, hence, facilitate a high speed operation of semiconductor device. In view of the above, semiconductor devices using a refractory metal as the material of electrodes, wirings and so on have been increasingly attracting attention. In spite of these merits, such semiconductor devices have not been able to occupy a leading position in the field of semiconductor technique, since the use of a refractory metal has not realized a semiconductor device having a structure with a stable insulating layer of good quality and a simple process of manufacturing the same, unlike the use of poly Si capable of forming thereon a stable thermally-oxidized SiO$_2$ film with good quality.

A structure having an insulating layer such as an SiO$_2$ film arranged on a refractory metal layer has been incorporated into some conventional semiconductor devices. However, such an SiO$_2$ film is formed by chemical vapor deposition (hereinafter abbreviated as "CVD") method or the like (SiO$_2$ film deposited by CVD method will hereinafter be referred to as "CVD SiO$_2$"), and, hence, the film is poor in quality. For example, the breakdown strength of the SiO$_2$ film thus formed is lower than that of the thermally-oxidized SiO$_2$ film. Moreover, in the case of CVD method, a CVD SiO$_2$ film is deposited all over the whole surface of the substrate including refractory metal and is not selectively formed only on the surface of the refractory metal. Furthermore, it is difficult to deposit the CVD SiO$_2$ with a uniform thickness over the surface of a step portion, where the CVD SiO$_2$ is usually formed in an overhanging manner. This disadvantageously leads to frequent occurrences of short circuit or disconnection in a semiconductor device having a three-layer structure of a conductor layer/a refractory metal layer with a step portion/a CVD SiO$_2$ layer as an insulating interlayer. Additionally, the deposition of CVD SiO$_2$ on the surface of the refractory metal layer requires complicated and time-consuming procedures of lowering once the temperature inside a CVD apparatus, prior to placing a structure having the refractory metal layer in the CVD apparatus in order to avoid oxidation of the refractory metal, filling the apparatus with an inert atmosphere, raising the temperature inside the apparatus, and introducing a reactive gas into the apparatus. Also, the conventional deposition of CVD SiO$_2$ involves the problems of breakdown strength of the resulting CVD SiO$_2$ film and of existence of pinholes in the film. In order to solve the problems, a CVD SiO$_2$ film must be thick, for example, with a thickness of 5,000 Å. This results in difficulties in realizing a high density fabrication of semiconductor devices.

As an example of semiconductor devices using poly Si or a refractory metal as mentioned above as a gate electrode, a MIS type field-effect transistor (hereinafter abbreviated as "MISFET") with a structure as shown in FIG. 1 has been proposed.

In FIG. 1, a MISFET device comprises a substrate 111 having a source region 112 and a drain region 113 therein, and a gate electrode 115 of poly Si or a refractory metal provided on the substrate 111 with a gate oxide layer 114 therebetween. On the gate electrode 115 an insulating CVD SiO$_2$ film 116 is formed. Contact holes 117 are provided through the CVD SiO$_2$ film 116 and the gate oxide layer 114 on the both sides of the gate electrode 115. A source electrode 118 and a drain electrode 119 are so provided through the contact holes 117 as to be in contact with the source region 112 and the drain region 113, respectively.

The structure of FIG. 1 is formed by ion implantation process by using the gate electrode 115 as a mask to form the source region 112 and the drain region 113 positioned in self-alignment with the gate electrode 115, depositing the CVD SiO$_2$ film 116, and forming the contact holes 117 by photolithographic and etching techniques. The CVD SiO$_2$ film 116 is formed uniformly not only on the surface of the gate electrode 115 but also on the gate oxide layer 114, so that it is necessary to form the contact holes 117 in the CVD SiO$_2$ film 116. A conventional photolithographic technique to be used in the formation of the contact holes 117 can attain only a limited precision and accordingly it is difficult to reduce the distance x between the side wall of the gate electrode 115 and the contact holes 117 to 1 μm or less.

Furthermore, in such a structure as mentioned above, the distance x cannot be reduced in the case that a refractory metal is used as a material of the gate electrode 115, particularly because the CVD SiO$_2$ has a low breakdown strength.

As described above, it is difficult, according to the conventional technique, to obtain a MISFET with a shortened distance x. Therefore, a high density fabrication of semiconductor devices cannot be realized. Furthermore, it is difficult in the conventional semiconductor device to realize a high speed operation of the semiconductor device because of a distance between the gate region under the gate electrode 115 and the contact holes 117.

SUMMARY OF THE INVENTION

An object of the present invention is to provide a semiconductor device in which an SiO$_2$ film having a high breakdown strength is formed on the surface of a layer of refractory metal.

Another object of the present invention is to provide a semiconductor device of the kind as described above and having an SiO$_2$ film with a high breakdown strength selectively only on the surface of an electrode made of a refractory metal.

A further object of the present invention is to provide a semiconductor device of the kind as described above and having a structure of an electrode and a contact hole in self-alignment with each other.

A still further object of the present invention is to provide a semiconductor device of the kind as described above and advantageously suited for high density fabrication.

A still yet further object of the present invention is to provide a high speed semiconductor device of the kind as described above.

A still yet further object of the present invention is to provide a semiconductor device of the kind as described above and having a structure suited for multi-layer wiring.

A still yet further object of the present invention is to provide a semiconductor device of the kind as described above and having few short circuits and disconnections in the electrode portion.

A still yet further object of the present invention is to provide a process for manufacturing a semiconductor device having an SiO$_2$ film with a high breakdown strength selectively formed only on the surface of a layer of refractory metal.

A still yet further object of the present invention is to provide a process for manufacturing a semiconductor device of the kind as described above with a high yield.

A still yet further object of the present invention is to provide a process for manufacturing a semiconductor device of the kind as described above and having few short circuits and disconnections.

A still yet further object of the present invention is to provide a process for manufacturing a semiconductor device having an electrode made of a refractory metal with a high yield.

A semiconductor device according to the present invention, which attains the above-mentioned objects, comprises a base consisting of a substrate having an insulating layer thereon, a refractory metal layer provided on the substrate, a layer of internally oxidized silicon (hereinafter often referred to as "inner SiO$_2$ layer"), and a silicon layer, the inner SiO$_2$ layer being provided between the refractory metal layer and the silicon layer and being formed by internally oxidizing an original silicon layer deposited on the refractory metal layer. Further, the former silicon layer is a part of the original silicon layer.

Here, the silicon layer can be in contact with the refractory metal layer through a through-hole formed in an area of the inner SiO$_2$ layer. Also, the silicon layer can be in contact with the substrate through a contact hole formed in an area of the insulating layer.

A preferred embodiment of a semiconductor device according to the present invention may comprise a refractory metal layer having a predetermined pattern, and at least one contact hole provided around at least one edge of the shaped refractory metal layer via an inner SiO$_2$ layer interposed therebetween. In this case, the contact hole and the predetermined pattern of the refractory metal layer is positioned in self-alignment with each other via the inner SiO$_2$ layer interposed therebetween. Two contact holes may be formed around at both edges of the predetermined shape of the refractory metal layer via the inner SiO$_2$ layer interposed therebetween. Two portions of a silicon layer respectively in contact with the substrate by way of the two contact holes may be isolated from each other.

Alternatively, the silicon layer may be so provided as to be isolated from another silicon layer formed in an area adjacent to the edge of the shaped refractory metal layer opposite the edge thereof adjacent to the contact hole via the inner SiO$_2$ layer interposed between the silicon layer and the refractory metal layer and covering the insulating layer in the above-mentioned area.

The first aspect of a process for manufacturing a semiconductor device according to the present invention comprises the steps of forming a refractory metal layer on a base consisting of a substrate having an insulating layer thereon, forming a refractory metal oxide layer in the surface portion of the refractory metal layer, forming a silicon layer on the refractory metal oxide layer, annealing the resulting structure in an atmosphere containing hydrogen to form an inner SiO$_2$ layer at the interface portion of the silicon layer on the side of the refractory metal layer.

The second aspect of a process according to the present invention comprises the step of oxidizing the surface portion of the silicon layer between the steps of forming the silicon layer on the refractory metal oxide layer, and forming the inner SiO$_2$ layer by annealing in the first aspect.

The third aspect of a process according to the present invention comprises the steps of forming a predetermined shape of a refractory metal layer on a base consisting of a substrate and an insulating layer thereon, forming a refractory metal oxide layer in the surface portion of the refractory metal layer, forming at least one contact hole in a portion of the insulating layer adjacent to at least one end of the resulting refractory metal layer covered by the refractory metal oxide layer, forming a silicon layer covering the contact hole and the refractory metal oxide layer, and annealing the resulting structure in an atmosphere containing hydrogen to form an inner SiO₂ layer at the interface portion of the silicon layer.

The forth aspect of a process according to the present invention comprises the step of oxidizing the surface portion of the silicon layer between the steps of forming the silicon layer on the refractory metal oxide layer and the contact hole, and forming the inner SiO₂ layer by annealing in the third aspect.

In the fifth and sixth aspects of the process according to the present invention, the step of forming the refractory metal oxide layer and the step of forming the contact hole in the third or fourth aspect may be carried out in reversed order.

BRIEF DESCRIPTION OF THE DRAWINGS

The foregoing and other features and advantages of the present invention will be apparent to those skilled in the art from the following detailed description taken in connection with the accompanying drawings in which:

FIGS. 19 to 21 are cross-sectional views showing other embodiments of a semiconductor device according to the present invention;

FIGS. 22A to 22G are cross-sectional views showing structures obtained in the intermediate steps of a process which are given for illustrating a process of manufacturing the semiconductor device shown in FIG. 18;

FIGS. 23A, 23B, 24A to 24C, 25A and 25B are cross-sectional views showing various structures obtained in the intermediate steps which are given for illustrating variations of the process of forming the semiconductor device shown in FIG. 18.

DETAILED DESCRIPTION OF PREFERRED EMBODIMENTS

The following Examples illustrate the present invention in more detail, but should not be construed as limiting the scope of the invention.

It should be noted in the following Examples that a refractory metal layer before oxidation is, strictly speaking, different in thickness from that after oxidation, and that the same can be said as regards refractory metal layer and silicon layer before and after formation of a layer of internally oxidized silicon, and silicon layer before and after surface oxidation, if carried out. However, such distinction throughout the specification will be painstaking, and is not believed to be necessary for understanding. Therefore, numerals indicating such layers will be attached without such distinction.

EXAMPLE 1

The procedures of manufacturing a semiconductor device according to the present invention will be explained with reference to FIGS. 2A to 2D.

Figure 1:
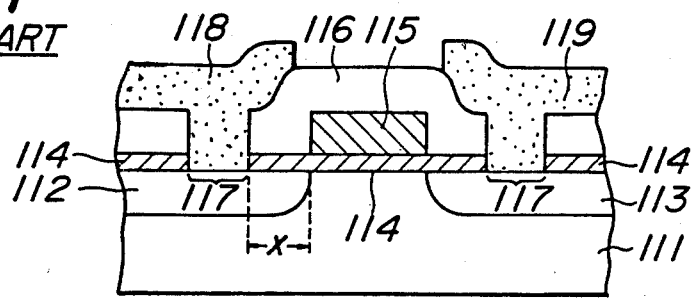
FIG. 1 is a cross-sectional view of a conventional MISFET.
Figure 2A:
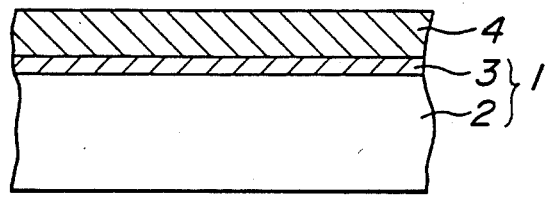
FIGS. 2A to 2D are cross-sectional views showing structures obtained in the respective steps of the process for manufacturing a semiconductor device according to the present invention.

A refractory metal layer 4 is formed on a base 1 consisting of a poly Si substrate 2 and an insulating layer 3 thereon, for example, a SiO₂ film with a thickness of 400 Å, to provide a structure shown in FIG. 2A. The material of the refractory metal layer 4 is required to have a low resistivity and a high heat resistance, and to provide an oxide thereof easily reducible upon annealing in an atmosphere containing hydrogen. Examples of the material include Mo, W, Ta and Ti. In this Example, detailed explanation will be given as regards the case where Mo is used as the material of the refractory metal layer 4. The refractory metal layer 4 shown in FIG. 2A has a thickness of about 3,000 Å and is a Mo film formed by electron beam deposition.

Figure 2B:
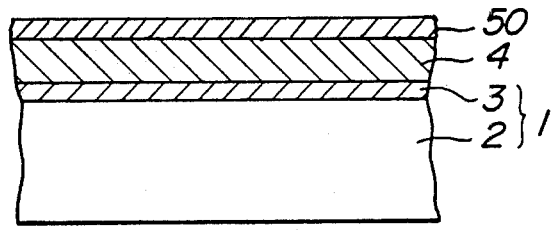

A refractory metal oxide layer 50 is formed by oxidizing the surface portion of the refractory metal layer 4 to provide a structure shown in FIG. 2B. In the case that Mo is used as the material of the refractory metal layer 4, molybdenum dioxide (hereinafter referred to as "MoO₂") and molybdenum trioxide (hereinafter referred to as "MoO₃") are, in general, oxides of Mo obtained stably. MoO₃ is easily obtained by subjecting Mo to low temperature annealing in an atmosphere containing oxygen. The sublimation of $MoO_3$ begins at a high temperature above 800° C. Therefore, the use of $MoO_3$ as the material of the refractory metal oxide layer 50 tends to cause damages such as peeling off of the $MoO_3$ film during the course of annealing to be carried out later. Accordingly, the refractory metal oxide layer 50 of molybdenum oxide is preferably made of $MoO_2$, which has a higher melting point of 1,900° C., and, hence, is stable during the course of annealing at a high temperature.

The formation of $MoO_2$ in the surface portion of the Mo film, however, is not easy in conventional technique. As a result of our extensive research, two methods of oxidizing Mo to form $MoO_2$ stably in the surface portion of the Mo film have now been found.

According to the first method, Mo is first oxidized in an oxygen atmosphere at about 300° C. to form $MoO_3$ in the surface portion of the Mo film, and the $MoO_3$ thus formed is subsequently annealed in an inert atmosphere of, for example, a nitrogen gas at a temperature higher than the temperature in case of the formation of $MoO_3$ and preferably at a temperature substantially equal to or higher than the sublimation point of $MoO_3$, so that $MoO_3$ is converted into $MoO_2$, whereby $MoO_2$ is formed in the surface portion of Mo.

According to the second method, Mo is annealed in an atmosphere of an inert gas, for example, a nitrogen gas, mixed with a slight amount (1% or less by volume) of an oxygen gas, preferably, at a temperature substantially equal to or higher than the sublimation point of $MoO_3$ to directly form $MoO_2$ in the surface portion of Mo. It was confirmed by X-ray diffraction and electron beam diffraction analyses that the oxide of molybdenum obtained in the surface portion of Mo according to either method was $MoO_2$.

In this Example, $MoO_2$ for the refractory metal oxide layer 50 was formed according to the above-mentioned first method. In this example, the base having the Mo layer thereon was subjected to annealing in an oxygen atmosphere at 300° C. for 60 minutes to form $MoO_3$ in the surface portion of the Mo layer, and subsequently annealing the resulting structure in a nitrogen atmosphere at 800° C. for 30 minutes to form an $MoO_2$ layer having a thickness of about 400 Å.

While, in this Example, $MoO_3$ was converted into $MoO_2$ at a temperature of 800° C., the inventors have confirmed that $MoO_3$ can be converted into $MoO_2$ at a temperature less than 800° C., for example, 700° C.

Figure 3:
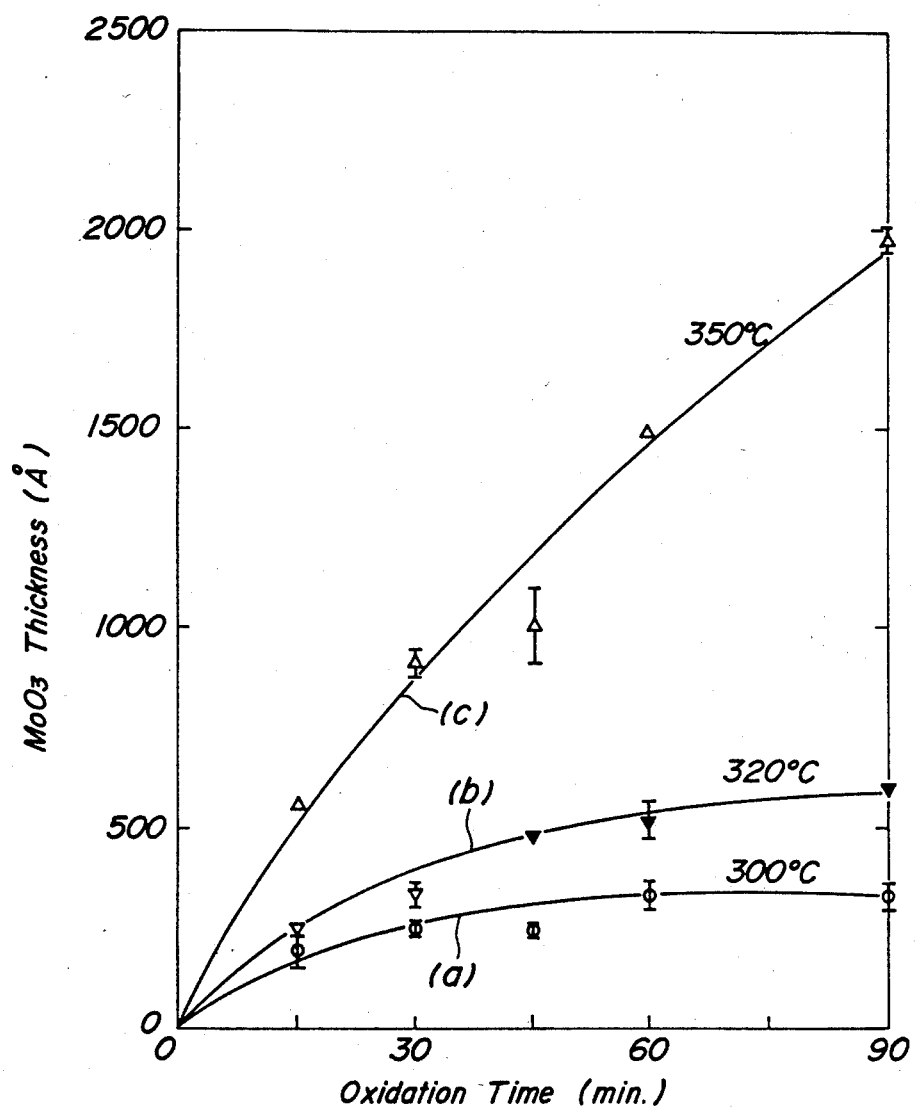
FIG. 3 is a graph illustrating the dependency of a MoO₃ film thickness on oxidation time.

FIG. 3 shows a relationship between an oxidation time and an $MoO_3$ film thickness. The curves (a), (b) and (c) illustrate the dependency of an $MoO_3$ film thickness on an oxidation time at film formation temperatures of 300° C., 320° C. and 350° C., respectively. It is to be noted that it is important to precisely control a thickness of the $MoO_3$ film for the purpose of controlling a thickness of the inner $SiO_2$ layer 5, which is to be formed later, since the thickness of the inner $SiO_2$ layer 5 depends on the thickness of the $MoO_2$ layer obtained by converting the $MoO_3$ film, as will be described later. FIG. 3 demonstrates that the thickness of the $MoO_3$ film can be precisely controlled when the $MoO_3$ film formation is carried out at about 300° C.

The first method of $MoO_2$ formation is superior to the second method from the viewpoints of control of $MoO_2$ film thickness and the prevention of oxygen diffusion excessively deep into the Mo layer. If oxygen diffuses into the Mo layer, the diffusion unfavorably entails large volume shrinkage of the $MoO_2$ layer upon $MoO_2$ reduction to be carried out later.

Subsequently, a silicon layer 6 is formed on the refractory metal oxide layer 50 to provide a structure shown in FIG. 2C. The material of the silicon layer 6 may either be poly Si or amorphous silicon. In this Example, the silicon layer of poly Si having a thickness of 3,500 Å was formed by electron beam deposition. An impurity, for example, As, is ion-implanted into the silicon layer 6 in order to lower the resistivity of the silicon layer 6. The silicon layer 6 of poly Si may be formed by other method, for example, by CVD method. An impurity as mentioned above may alternatively be added to the silicon layer 6 at the same time that the silicon layer is formed. The impurity concentration in the silicon layer 6 of poly Si may, of course, be chosen adequately according to the use of poly Si.

Figure 2C:
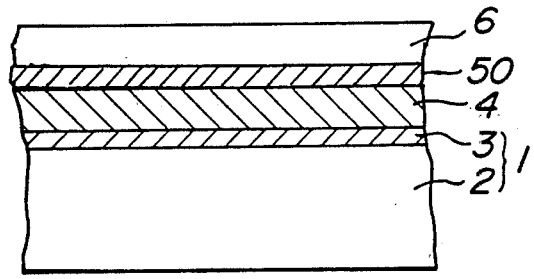

Subsequently, the structure shown in FIG. 2C is annealed in an atmosphere of a hydrogen gas or an inert gas (e.g., nitrogen gas) mixed with a hydrogen gas to reduce the refractory metal oxide layer 50, and at the same time to internally oxidize the inner interface portion of the silicon layer 6 from the side of the refractory metal layer 4 to provide a structure shown in FIG. 2D and comprising the inner $SiO_2$ layer 5 between the refractory metal layer 4 and the silicon layer 6. The inner $SiO_2$ layer 5 is formed over the entire surface of the refractory metal layer 4.

Since the refractory metal oxide layer 50 of $MoO_2$ is the source for supplying oxygen to oxidize the silicon layer 6, the internal oxidation of the silicon layer 6 occurs selectively only in the region of the silicon layer 6 which is in contact with the refractory metal oxide layer 50.

In this Example, the annealing was carried out in a hydrogen atmosphere at 1,000° C. for 60 minutes to reduce $MoO_2$ into Mo, and at the same time to form the inner $SiO_2$ layer 5 having a thickness of about 700 Å. The conditions of the annealing, which were 1,000° C. in temperature and 60 minutes in time in this Example, are satisfactory, if the refractory metal oxide layer is reduced while at the same time the silicon layer is internally oxidized at the interface portion thereof. Therefore, it is sufficient that the annealing temperature is as low as 800° C. in some cases. The inner $SiO_2$ layer 5 may be vitrified into phosphorus glass by using an annealing atmosphere containing phosphine($PH_3$).

While, in this Example, the inner $SiO_2$ layer was formed in the hydrogen atmosphere containing 100% hydrogen, it is not required that the atmosphere contains 100% hydrogen. If the percentage of hydrogen in the atmosphere is reduced, only a formation rate of the inner $SiO_2$ layer is lowered. The inventors have confirmed that the inner $SiO_2$ layer is formed, even if the hydrogen atmosphere contains hydrogen only in the order of about 10%.

Figure 4A:
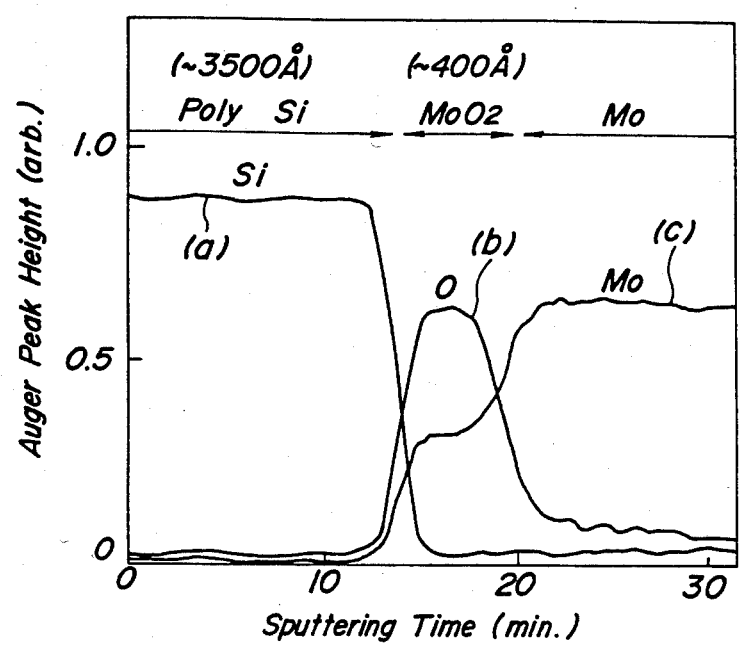
FIGS. 4A and 4B are diagrams illustrating constituent depth profiles of elements of semiconductor devices manufactured according to a process of this invention which were examined by Auger electron spectroscopy analysis.
Figure 4B:
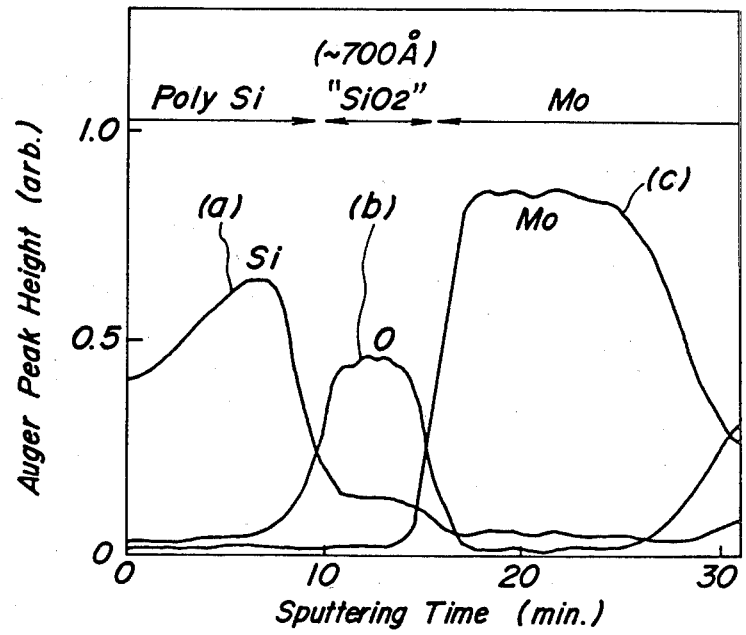

The intrastructural change by $MoO_2$ reduction and internal Si oxidation will be explained with reference to FIGS. 4A and 4B illustrating the constituent depth profiles examined by Auger electron spectroscopy analysis with respect to the structure shown in FIG. 2C before the formation of the inner $SiO_2$ layer and the structure shown in FIG. 2D after the formation of the inner $SiO_2$ layer, respectively. The constituent depth profiles ranges from the surface of the silicon layer 6 towards the substrate 2, and are plotted in relation to a sputtering etching time, which corresponds to a depth from the surface of the silicon layer 6. The curves (a), (b) and (c) represent silicon, oxygen and Mo, respectively.

FIG. 4A clearly demonstrates the formations of the $MoO_2$ layer on the Mo layer and the poly Si layer on the $MoO_2$ layer. A comparison of FIG. 4B with FIG. 4A proves that $MoO_2$ constituting the middle layer in FIG. 4A was reduced into Mo, and that the inner $SiO_2$ layer having a thickness of about 700 Å developed from around the interface of poly Si and $MoO_2$ towards the surface of poly Si.

FIG. 4B clearly indicates that Mo contained little oxygen, that Mo was not oxidized during the course of the formation of the inner $SiO_2$ layer shown as "$SiO_2$" in this drawing, and that no reaction occurred between Mo and Si to form molybdenum silicide. Judging from FIG. 4B, the Auger constituent depth profile has very sharp gradient lines in both the areas corresponding to the interfaces between the silicon layer of poly Si and the inner $SiO_2$ layer and between the inner $SiO_2$ layer and the Mo layer, and accordingly it is understood that both the interfaces were very homogeneous and uniform.

Figure 2D:
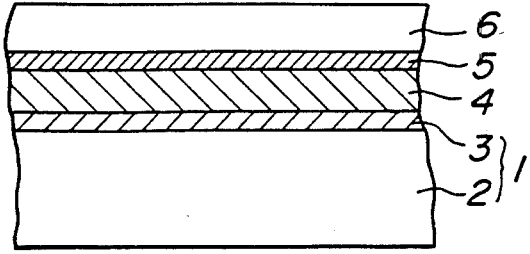

The above-mentioned formation of the inner $SiO_2$ layer 5 shown in FIG. 2D by annealing the structure shown in FIG. 2C in an atmosphere containing a hydrogen gas is believed to occur according to the following mechanism. First, $MoO_2$ may be reduced according to a reaction as shown below.

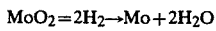

$$MoO_2 + 2H_2 \rightarrow Mo + 2H_2O$$

$H_2O$ formed in the reaction oxidize poly Si constituting the silicon layer 6 to form the inner $SiO_2$ layer 5. Since $MoO_2$ serves as the source of oxygen, the inner $SiO_2$ layer 5 is formed all over the refractory metal layer 4 of Mo. An amount of hydrogen in the annealing atmosphere should be at least an amount sufficient to be used up in the above-mentioned reduction reaction. The amount of $H_2O$ generated in the reduction reaction is limited at most to an amount corresponding to the amount of oxygen contained in $MoO_2$. Therefore, it should be noted that the maximum attainable thickness of the inner $SiO_2$ layer 5 is determined by the thickness of the layer of $MoO_2$.

The quality of the inner $SiO_2$ layer 5 formed in the manner mentioned above was examined by various methods. The results will be explained. The chemical composition of the inner $SiO_2$ layer 5 was examined by XPS (X-ray photoelectron spectroscopy). As a result, it was found that the Si(2p) binding energy of silicon contained in the layer was 103.3 eV, which is substantially equal to the Si(2p) binding energy (103.4 eV) of silicon contained in an $SiO_2$ film formed by ordinary thermal oxidation of silicon. Thus, it is concluded that the chemical composition of the inner $SiO_2$ layer 5 is almost the same as that of the ordinary thermal-oxidation $SiO_2$ film.

The etching speed of the inner $SiO_2$ layer 5 in dilute fluoric acid (hydrogen fluoride: water = 3 : 100 by volume) was examined to be 120 Å/minute, which substantially coincides with the etching speed (109 Å/minute) of the ordinary thermal-oxidation $SiO_2$ film in the same dilute fluoric acid.

A poly Si-Al two-layer electrode having a size of 500 micron meter × 500 micron meter was formed on the inner $SiO_2$ layer 5. The breakdown strength and leakage current of the inner $SiO_2$ layer 5 was then examined. The breakdown strength was above $10^6$ V/cm and the leakage current was below $10^{-12}$ A. These values substantially coincide with those of the ordinary thermal-oxidation $SiO_2$ film.

From the results of the above examinations, it is concluded that the quality of the inner $SiO_2$ layer 5 is substantially the same as that of the ordinary thermal-oxidation $SiO_2$ film.

As is apparent from the above, according to the present invention, the inner $SiO_2$ layer 5 having excellent insulating properties can advantageously be formed easily on the surface of the refractory metal layer 4. Additionally, the formation of the inner $SiO_2$ layer 5 is homogeneously and uniformly made selectively only on the surface of the refractory metal layer 4, since the oxidation of silicon in the interface portion of the silicon layer 6 is achieved by $H_2O$ produced by the reduction reaction of the refractory metal oxide layer 50 uniformly formed on the surface of the refractory metal layer 4.

Therefore, the silicon layer 6 is quite well isolated from the refractory metal layer 4 without short circuit except for a portion where a through-hole is formed in the inner $SiO_2$ layer 5. Even if the refractory metal layer 4 has a step portion providing steep end, the inner $SiO_2$ layer 5 never overhangs around such a portion. Accordingly, disconnection of the silicon layer 6 does not occur on the inner $SiO_2$ layer 5.

Furthermore, the thickness of the inner $SiO_2$ layer 5 covering the side wall of the above-mentioned step portion can be as small as about 700 Å, which is about 1/7 the thickness of a conventional CVD $SiO_2$ film. This reduction of thickness facilitates a higher density fabrication of semiconductor devices. Additionally, the inner $SiO_2$ layer 6 is simply formed on the refractory metal layer 4 without requiring complicated procedures or a long time, unlike the conventional formation of CVD $SiO_2$ on Mo, where complicated and time consuming procedures are required not to form $MoO_3$.

EXAMPLE 2

Figure 5:
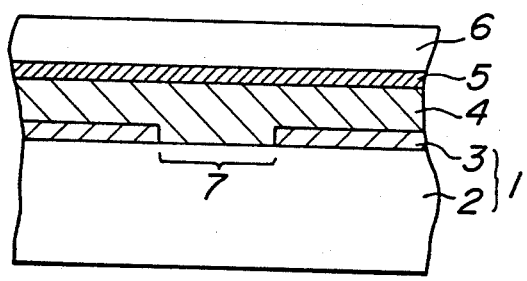
FIG. 5 is a cross-sectional view showing a semiconductor device of Example 2 according to the present invention.
Figure 6:
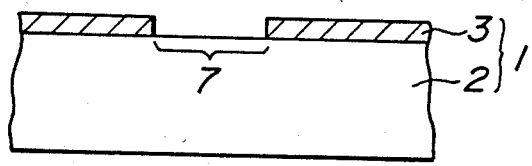
FIG. 6 is a cross-sectional view showing a structure obtained in an intermediate step of the process of manufacturing the semiconductor device of Example 2 shown in FIG. 5.

The insulating layer 3 which entirely covers the substrate 2 is not always essential in a semiconductor device of this invention. The insulating layer 3 may, for example, comprise a so-called direct contact structure in which the refractory metal layer 4 is directly in contact with the substrate 2 by way of a contact hole 7 formed in the insulating layer 3, as is shown in FIG. 5.

Such a structure can be obtained by using the base 1 comprising an insulating layer 3 having a contact hole 7 and formed on the substrate 2 according to the same procedures as used for obtaining the structures shown in FIGS. 2A to 2D in sequence.

EXAMPLE 3

Figure 7:
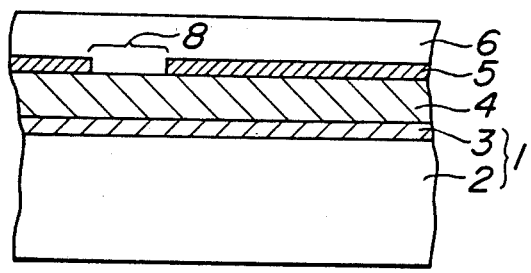
FIG. 7 is a cross-sectional view showing the semiconductor device of Example 3 according to the present invention.

The inner $SiO_2$ layer 5 does not necessary cover the entire surface of the refractory metal layer 4 in a semiconductor device of this invention. The inner $SiO_2$ layer 5 may, for example, comprise a structure in which the silicon layer 6 is in contact with the refractory metal layer 4 by way of a through-hole 8 formed in the inner $SiO_2$ layer 5 as is shown in FIG. 7.

Such a structure can be obtained by forming the through-hole 8 in some portion of the refractory metal oxide layer 50 according to known photolithographic and etching technologies after the steps of forming the structures shown in FIGS. 2A and 2B. Subsequently, the structure shown in FIG. 7 is formed by the same procedures as used for obtaining the structures shown in FIGS. 2C and 2D in sequence.

EXAMPLE 4

The base 1, on which the refractory metal layer 4 is to be formed, is not always required to have the insulating layer 3 on the substrate 2 in a semiconductor device of this invention. The base 1 may be a combination of various layers provided in the course of semiconductor device fabrication.

Figure 8:
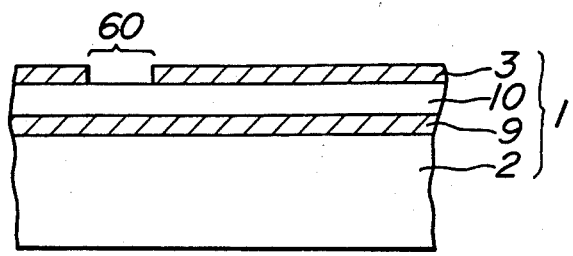
FIG. 8 is a cross-sectional view showing a structure obtained in an intermediate step of the process of manufacturing the semiconductor device of Example 3 shown in FIG. 9.
Figure 9:
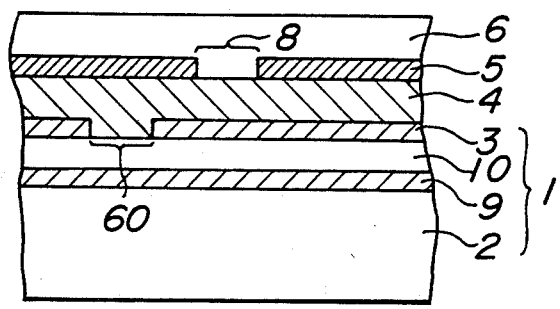
FIGS. 9 and 10 are cross-sectional views showing the semiconductor devices of Examples 4 and 5, respectively, according to the present invention.

For example, in FIG. 8, the base 1 comprises, the substrate 2, an insulating layer 9 like an $SiO_2$ film, a conductive layer 10 of poly Si, metal or the like, and another insulating layer 3 having a through-hole 60, which are arranged in this order. The same procedures as used for obtaining the structures shown in FIGS. 2A and 2B are applied in sequence to the base 1 shown in FIG. 8, and then the formation of a through-hole 8 is formed in the same manner as in the case of the formation of the structure shown in FIG. 7. A structure shown in FIG. 9 is formed by the same procedures as used for obtaining the structures shown in FIGS. 2C and 2D in sequence. In this structure, the refractory metal layer 4 is in contact with both the silicon layer 6 and the conductive layer 10 by way of the throughholes 8 and 60, respectively.

In the process of this invention, the refractory metal oxide layer formed on the refractory metal layer serves as the source of oxygen enabling the silicon layer on the refractory metal layer to be oxidized from the inside.

The foregoing Examples were given as regards the cases where the refractory metal layer has an evenly extended surface for the sake of easy understanding of the present invention. It should be noted that a process of this invention is particularly advantageous for a selective formation of an inner $SiO_2$ layer as an insulating layer only on the surface of a refractory metal layer having a rectangular section or step portion having a sharp edge. The following examples of this invention includes a semiconductor device having such a step portion.

EXAMPLE 5

Figure 10:
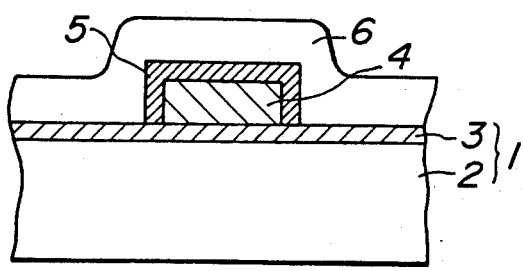

A semiconductor device shown in FIG. 10 has an inner $SiO_2$ layer 5 selectively formed only on the surface of such a refractory metal layer 4 as has a step portion. The silicon layer 6 is formed to cover the entire surface of the inner $SiO_2$ layer 5.

Figure 11A:
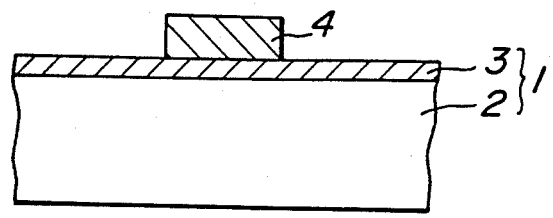
FIGS. 11A to 11C are cross-sectional views showing structures obtained in the respective steps of the process of manufacturing the semiconductor device of Example 5 shown in FIG. 10.
Figure 11B:
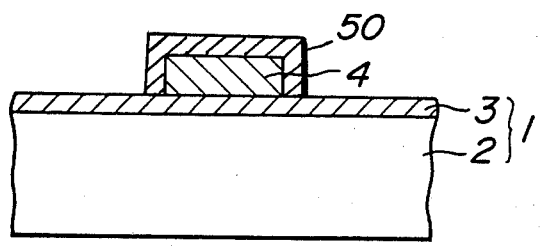
Figure 11C:
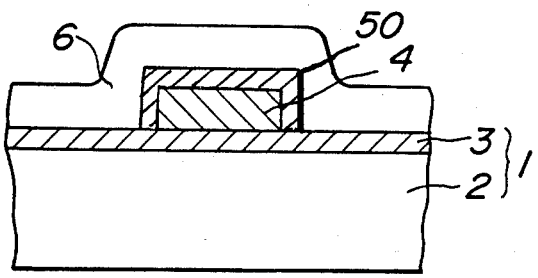

In order to fabricate the semiconductor device of this type shown in FIG. 10, at first the structure shown in FIG. 2A is prepared. The resulting structure is processed in such a way that the refractory metal layer 4 has a predetermined shape e.g., a rectangular cross-section as shown in FIG. 11A. Subsequently, the same procedures as used for obtaining the structures shown in FIGS. 2B, 2C and 2D follow to obtain structures shown in FIGS. 11B, 11C and 10, respectively in sequence.

EXAMPLE 6

Figure 12:
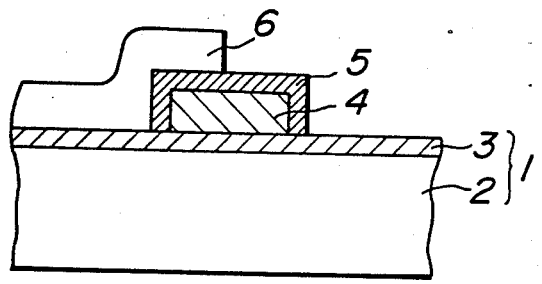
FIG. 12 is a cross-sectional view showing the semiconductor device of Example 6 according to the present invention.

The semiconductor device of this invention may have a structure having the silicon layer 6 only covering a part of the entire surface of the layer 5 of internally oxidized silicon, for example, as is shown in FIG. 12. Such a structure can be obtained by processing the structure shown in FIG. 10 in such a way that the silicon layer 6 has a predetermined sectional shape.

In the structures shown in FIGS. 10 and 12, the layer 5 of internally oxidized silicon is selectively formed only on the surface of the refractory metal layer 4, and does not exist on the insulating layer 3 having no refractory metal layer 4 thereon.

In another modification of a semiconductor device of the above type according to the present invention, the semiconductor device has an exposed portion of refractory metal. At first, an exposed portion of $MoO_2$ 50 can be obtained by processing the structure shown in FIG. 11C in such a way that the silicon layer 6 has a predetermined shape. Subsequently, the same procedure as used for obtaining the structure shown in FIG. 10 follows, so that the inner $SiO_2$ layer 5 is selectively formed only at the interface region in a region where the silicon layer 6 covers the refractory metal oxide layer 50, while the refractory metal oxide layer 50 in the remaining region thereof not covered by the silicon layer 6 is reduced to provide the exposed portion of refractory metal.

In the structures without a through-hole such as shown in FIGS. 2D, 5, 10 and 12, the inner $SiO_2$ layer 5 for isolating the refractory metal layer 4 from the silicon layer 6 has substantially the same properties, e.g., breakdown strength, as those of the ordinary thermal-oxidation $SiO_2$ film, as described before. Therefore, the semiconductor device of this invention has excellent insulating characteristics and is well suited for multi-layer wiring. Even if the refractory metal layer 4 has a step portion like the structure shown in FIG. 10 or 12, no short circuit occurs between the refractory metal layer 4 and the silicon layer 6, and no disconnection occurs in the silicon layer 6, since the layer 5 of internally oxidized silicon is selectively and uniformly formed, without overhanging, only on the surface of the refractory metal layer 4. Furthermore, in the case where the refractory metal layer 4 has a predetermined shape like in the structure as shown in FIG. 10 or 12, it is sufficient that the layer 5 of internally oxidized silicon is thin, and consequently this small thickness of the layer 5 on the side wall of the refractory metal layer 4 is advantageous to the extent that the layer 5 is thin in order to realize a higher density fabrication of semiconductor devices.

In the structure as shown in FIG. 12, the exposed surfaces are only the insulating layer 3, a part of the layer 5 of internally oxidized silicon and the silicon layer 6. These layers can resist to acid washing, thus facilitating the surface cleansing.

EXAMPLES 7 TO 9

Figure 13:
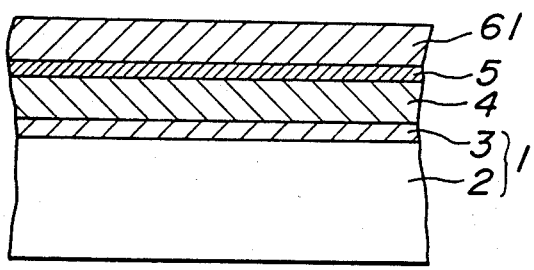
FIGS. 13 to 15 are cross-sectional views showing other aspects of the semiconductor devices of Examples 7 to 9, respectively, according to the present invention.

In the foregoing Examples, it is contemplated that poly Si be used in itself as wirings, electrodes and so on. However, according to the purpose, poly Si deposited may, of course, be subjected to any of various processing procedures. For example, the poly Si deposited may be entirely oxidized to provide an insulation layer 61 as shown in the structure of FIG. 13 (Example 7).

Figure 14:
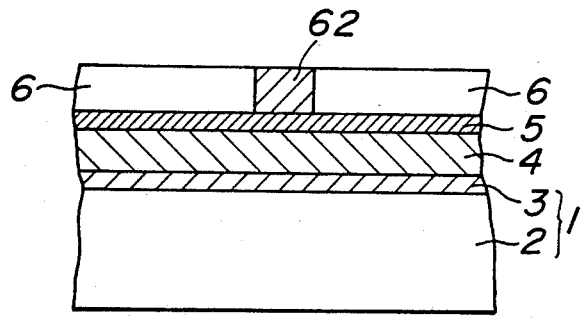

Alternatively, only a partial area of the poly Si deposited may be oxidized to provide an insulation 62 region as shown in the structure of FIG. 14 (Example 8) for mutually isolating the two portions of the remaining poly Si.

Figure 15:
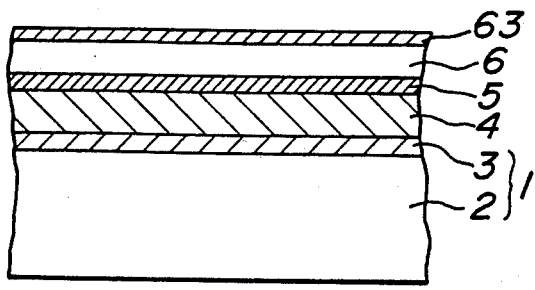

Alternatively, an insulation layer 63 may be formed by oxidizing only the surface portion of the poly Si deposited as shown in FIG. 15 and another layer may optionally be formed on the insulation layer 63 (Example 9).

In the foregoing Examples, $MoO_2$ is all reduced during the course of the formation of the inner $SiO_2$ layer. Alternatively, only a part of $MoO_2$ may be reduced, while at the same time the silicon layer 6 is oxidized to form the inner SiO$_2$ layer 5.

In Example 1 given with reference to FIGS. 2A to 2D, if the silicon layer 6 of poly Si is thin (e.g., with a thickness of 1,500 Å), difficulties are encountered when forming a relatively thick inner SiO$_2$ layer at the interface between Mo and poly Si. It is considered that the reason for the difficulties is that the thin silicon layer 6 allows H$_2$O generated during the course of the formation of the inner SiO$_2$ layer to easily escape through the pinholes and grain boundaries in the silicon layer 6. In order to solve such a defect, an SiO$_2$ film 70 may be formed on the silicon layer 6, after obtaining the structure shown in FIG. 2C, to obtain a structure shown in FIG. 16A, and then the same procedure as used for obtaining the structure shown in FIG. 2D follows. In this manner, a structure shown in FIG. 16B is obtained. The SiO$_2$ film 70 may be either used as such or removed according to a manner of fabrication.

Figure 16A:
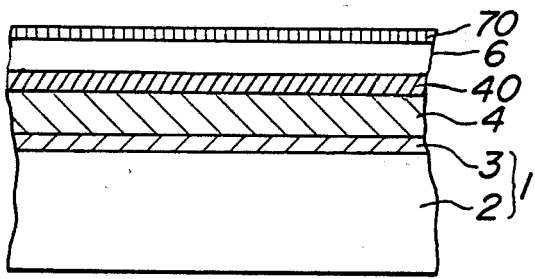
FIGS. 16A and 16B are cross-sectional views showing a semiconductor device and an intermediate structure thereof given for illustrating other aspect of a process according to the present invention, respectively.
Figure 16B:
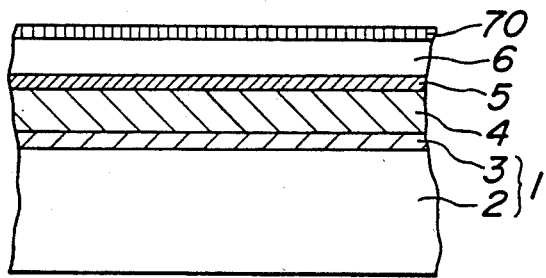
Figure 17A:
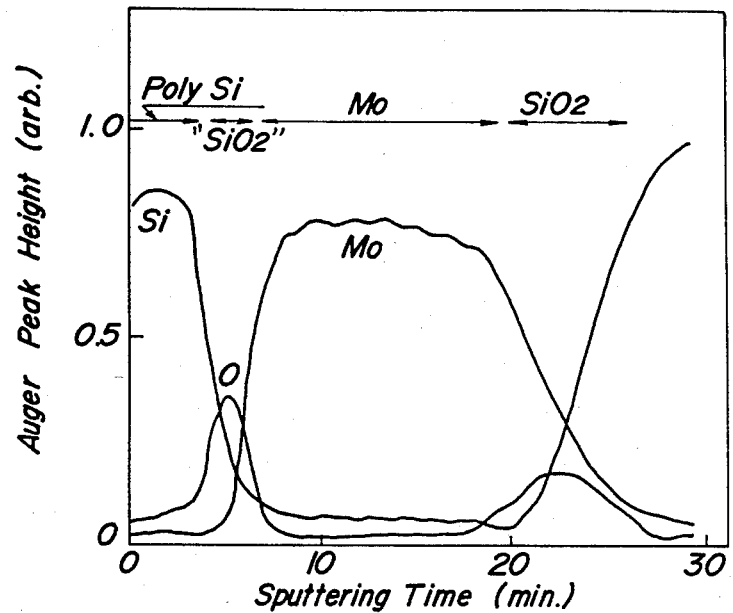
FIGS. 17A and 17B are diagrams illustrating constituent depth profiles of elements of other aspects of semiconductor devices manufactured according to a process of this invention which were examined by Auger electron spectroscopy analysis.
Figure 17B:
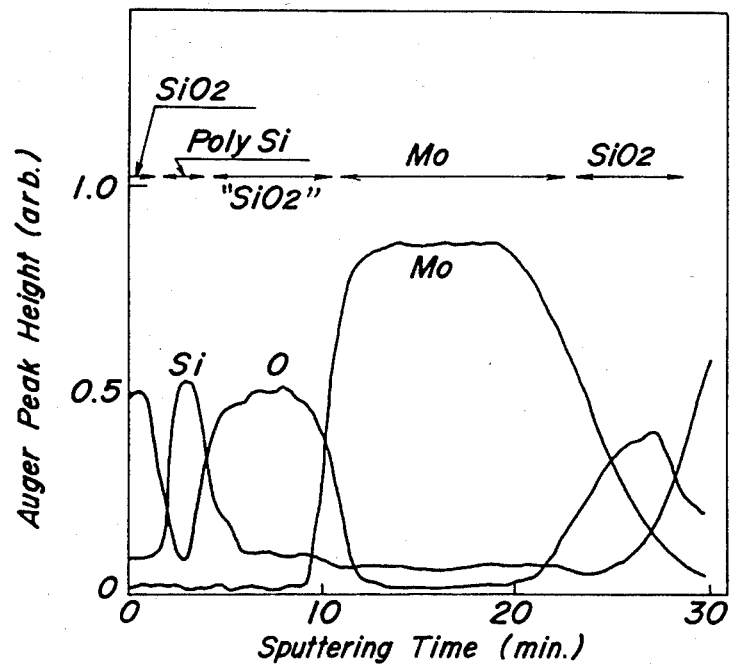

FIGS. 17A and 17B comparatively show the constituent depth profiles of a structure obtained by forming an inner SiO$_2$ layer in a precursor structure, without the SiO$_2$ layer 70, of the structure shown in FIG. 16A and of a structure obtained by forming an inner SiO$_2$ layer (shown as "SiO$_2$" in the drawing) in the structure shown in FIG. 16A having the SiO$_2$ layer 70, respectively. The depth profiles were obtained according to Auger electron spectroscopy analysis. Here, the silicon layer 6 was a poly Si layer having a thickness of 1,100 Å formed by electron beam deposition method. The SiO$_2$ layer 70 of 400 Å in thickness was formed by thermally-oxidized the silicon layer 6 in the surface portion thereof. Each of the constituent depth profiles shows a distribution of the constituting elements ranging from the surface of the silicon layer 6 or the SiO$_2$ layer 70 towards the substrate 2. FIG. 17B demonstrates in comparison with FIG. 17A that the inner SiO$_2$ layer (shown as "SiO$_2$" in the drawing) was formed with a comparatively large thickness and that the respective interfaces formed between poly Si and the inner SiO$_2$ layer and between the inner SiO$_2$ layer and Mo were homogeneous and uniform in the case of the structure having the SiO$_2$ layer 70. It was also confirmed that Mo was not oxidized during the course of the thermaloxidation formation of the SiO$_2$ layer 70.

Irrespective of the thickness of the silicon layer 33 of poly Si, the SiO$_2$ layer formed on the surface of poly Si provides better controllability of inner SiO$_2$ layer formation, since various influences of the film quality of poly Si on the formation of the inner SiO$_2$ layer disappear.

Other countermeasures for obviating the defect due to the thin silicon layer 6 utilize the favorable effects of making the surface of the silicon layer 6 amorphous, or covering the silicon layer 6 with a dense film. More specifically, a film of CVD SiO$_2$ or a silicon nitride may be deposited on the surface of the silicon layer 6. Alternatively, the surface portion of the silicon layer 6 may be directly nitrided.

As described hereinbefore, when MoO$_3$ is used as the refractory metal oxide layer 50, unfavorable peeling or the like of MoO$_3$ is likely to occur in the later annealing step. In view of this, care must be given to the conditions of the thermal oxidation formation of the SiO$_2$ layer 70 on the poly Si layer so as not to allow oxygen to diffuse into the refractory metal oxide layer 50 of MoO$_2$ through pinholes and poor crystallinity regions of the silicon layer 6, which results in the unfavorable formation of MoO$_3$. In this sense, CVD or sputtering method is more advantageous than thermal oxidation method as a method of forming an SiO$_2$ layer on the surface of poly Si, since the former method can be processed at a lower temperature without any influences upon a quality of the silicon layer 6 of poly Si.

The semiconductor device and process of the present invention are not restricted to those described in the foregoing Examples, but can include broad variations and modifications, and, therefore, any minor departure therefrom or extension thereof is considered as being within the skill of the artisan and as falling within the scope of this invention.

The foregoing description of the preferred embodiments has been mainly made with reference to the case where Mo is used as the refractory metal. Any kind of refractory metal may be used in the present invention, so far as the metal can be reduced by annealing in an atmosphere comprising hydrogen. In this sense, it will be easily understood that most of refractory metals such as Ta, W, Ti are employable in the present invention. In the case of a semiconductor device fabrication process which does not involve any procedure to be carried out at a high temperature, a metal having a melting point lower than those of refractory metals may be used instead, so far as it is reducible in an atmosphere containing hydrogen.

EXAMPLE 10

Figure 18:
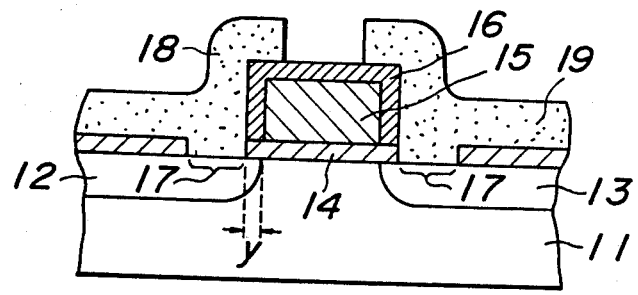
FIG. 18 is a cross-sectional view showing a MISFET as one embodiment of a semiconductor device according to the present invention.

FIG. 18 shows an embodiment of the semiconductor device according to the present invention which is applied to MISFET. Reference numeral 11 denotes a substrate, for example, a p-type single crystal silicon substrate having a resistivity of about 3 Ωcm. The substrate 11 has a source region 12 and a drain region 13 and, for example, each region has an n-type impurity surface concentration of $2 \times 10^{20}$cm$^{-3}$ and has a thickness of 0.25 μm. On the substrate 11 are provided a gate oxide layer 14 and a gate electrode 15 thereon which is a layer made of refractory metal, e.g., Mo, of 0.3 μm in thickness. The gate electrode 15 has a predetermined shape, e.g., a rectangular cross-section. A layer 16 made of internally oxidized silicon of, for example, 700 Å in thickness is formed by internally oxidizing a silicon layer to be used as a source electrode 18 and a drain electrode 19 from the inside thereof, i.e., from the side of the refractory metal layer constituting the gate electrode 15. Contact holes 17 are formed in the gate oxide layer 14, and positioned with a self-alignment relationship with the gate electrode 15 via the inner SiO$_2$ layer 16. The source and drain electrodes 18 and 19 in the form of silicon layer are provided in contact with the source and drain regions 12 and 13, respectively, by way of the contact holes 17. The silicon layers constituting the source and drain electrodes 18 and 19 may be made of either poly Si or amorphous silicon, and may have, for example, a thickness of 0.35 μm and an impurity concentration thereof may be about $10^{21}$cm$^{-3}$.

This MISFET can be of small element size and has a structure suited for achieving a high density fabrication in comparison with a counterpart using CVD SiO$_2$, since the gate electrode 15 and the contact holes 17 are positioned in self-alignment with each other via the thin inner SiO$_2$ layer 12 having a thickness of y, which is selectively formed only on the surface of the gate electrode 15.

Furthermore, the operation speed of the semiconductor device can be improved, since the distance y between the gate electrode 15 and the contact hole can be reduced.

Moreover, the MISFET according to the present invention has improved characteristics of insulation between the gate electrode 15 and the source electrode 18 or the drain electrode 19, since the inner SiO$_2$ layer 16 has substantially the same quality including breakdown strength as that of the thermal-oxidation SiO$_2$ film mentioned above.

EXAMPLE 11

Figure 19:
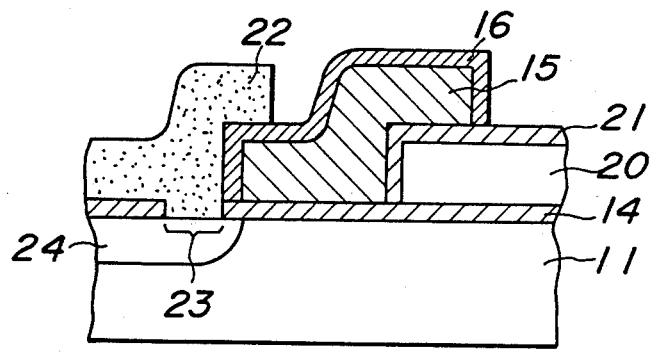

FIG. 19 shows an embodiment of a semiconductor device according to the present invention which is applied to a two-layer gate structure. A cell plate electrode 20 made of poly Si is provided on the gate oxide layer 14. An SiO$_2$ layer 21 is formed, for example, by oxidation of poly Si with a thickness of 0.1 $\mu$m, on the cell plate electrode 20. The gate electrode 15 formed by a refractory metal layer is so provided as to cover parts of the gate oxide layer 14 and the SiO$_2$ layer 21. The layer 16 of internally oxidized silicon is provided on the surface of the gate electrode 15. A silicon layer 22 is so provided as to cover a part of the inner SiO$_2$ layer 16 and as to contact a region 24 in the substrate 11 by way of a contact hole 23. The above-mentioned cell plate electrode 20 is used as an electrode of capacitive region. The semiconductor device of this structure has the contact hole 23 positioned in self alignment with the gate electrode 15 via the inner SiO$_2$ layer 16, alike the structure shown in FIG. 18. The number of contact holes is one per one gate electrode.

EXAMPLES 12 AND 13

Figure 20:
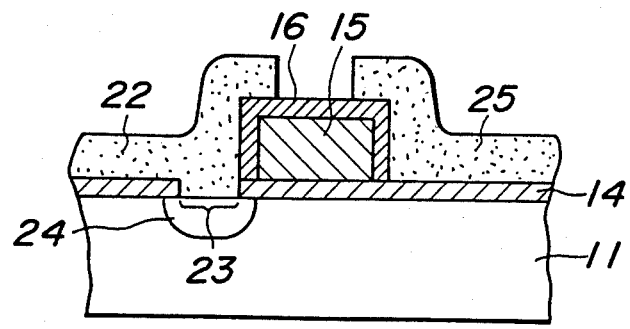

FIGS. 20 and 21 show other examples of semiconductor devices with one contact hole for one gate electrode according to the present invention The semiconductor device shown in FIG. 20 (Example 12) comprises the gate electrode 15 provided on the substrate 11 with the gate oxide layer 14 therebetween and having the inner SiO$_2$ layer 16 formed on the surface of the gate electrode 15. A silicon layer 22 contacts a region 24 in the substrate 11 by way of the contact hole 23 positioned in self-alignment with the gate electrode 15 substantially on one side of the gate electrode 15 via the inner SiO$_2$ layer 16. Substantially on the other side of the gate electrode 15, a cell plate electrode 25 is provided on the gate oxide layer 14 via the inner SiO$_2$ layer 16. The cell plate electrode 25 consists of another silicon layer isolated from the silicon layer 22.

The semiconductor device shown in FIG. 21 (Example 13) comprises the gate electrode 15 in the form of a refractory metal layer provided on the substrate 11 via the gate oxide layer 14 and a cell plate electrode 26 made of another refractory metal layer provided on the substrate 11 via the gate oxide layer 14. The inner SiO$_2$ layers 16 are formed on the surfaces of the gate electrode 15 and the cell plate electrode 26. The silicon layer 22 is so provided as to cover the inner SiO$_2$ layers 16 and the gate oxide layer 14. The silicon layer 22 contacts the region 24 in the substrate 11 by way of the contact hole 23 positioned in self-alignment with the gate electrode 15 substantially on one side of the gate electrode 15 via the inner SiO$_2$ layer 16. The substrate 11 has another region 27 therein, corresponding to an area of gap formed between the other side of the gate electrode 15 and the cell plate electrode 26. It is not necessary that the layer 22 always covers both of the gate electrode 15 and the cell plate electrode 26, but it is sufficient that the silicon layer 22 is in contact with the region 24 by way of the contact hole 23.

In the structures of FIGS. 19 to 21, the substrate 11, the regions 24 and 27 and the silicon layers 22 and 25 may be of the same type as the substrate 11, the regions 12 and 13, and the silicon layers 18 and 19 in the structure shown in FIG. 18, respectively.

In the structures of FIGS. 19 to 21, the layer 16 of internally oxidized silicon is selectively provided only on the surface of the refractory metal layer used either as the gate electrode 15 or the cell plate electrode 26, and not provided on the surface of any other areas. The semiconductor devices shown in FIGS. 19 to 21 are suitable to a higher density fabrication of integrated circuits, since the gate electrode 15 and the contact hole 23 are positioned in self-alignment with each other via the thin inner SiO$_2$ layer 16. Furthermore, the distance between the gate region and the contact hole can be reduced, so that the semiconductor devices can be integrated with a high integration density and high speed operations can be realized.

While the descriptions with reference to FIGS. 19 to 21 have been made of the cases where the silicon layers 18, 19, 22 and 25 have exposed surfaces in order to simplify the explanations, a wiring layer or the like may, of course, be provided on these structures, if desired.

EXAMPLE 14

An example of procedures for manufacturing the semiconductor device shown in FIG. 18 according to the process of this invention will be explained in detail with reference to FIGS. 22A-22G.

An SiO$_2$ layer, e.g., of 400 Å in thickness, which is an insulating layer used as the gate oxide layer 14, is formed on the substrate 11 of p-type single crystal silicon. A refractory metal layer is formed on the gate oxide layer 14, and processed by known photolithographic and etching techniques to form the gate electrode 15. As a result, a structure shown in FIG. 22A is obtained. The material of the refractory metal layer, from which the gate electrode 15 is to be formed, is required to have a low resistivity and a high heat resistance, and to provide an oxide thereof which is easily reducible by annealing in an atmosphere including hydrogen. Examples of the material include Mo, W, Ta and Ti. The case where Mo is used as the material of the refractory metal layer will be explained in detail in this Example. The gate electrode 15 in FIG. 22A is a Mo film formed by electron beam deposition, the thickness of which is about 3,000 Å.

Subsequently, an n-type impurity, e.g., arsenic, in a dosage of $4 \times 10^{15}$ cm$^{-2}$ is ion-implanted into the substrate 11 by using the gate electrode 15 as the mask at an implantation energy of 100 KeV and then annealing is carried out to form the source region 12 and the drain region 13, so that a structure is obtained as shown in FIG. 22B.

Subsequently, the surface portion of the refractory metal layer as the gate electrode 15 is oxidized to form a refractory metal oxide layer 31, so that a structure is obtained as shown in FIG. 22C. As described before, in the case that Mo is used to form the refractory metal layer, MoO$_2$ and MoO$_3$ are, in general, stably obtained as oxide of Mo. In the present invention, MoO$_2$ which has a high melting point of 1,900° C. and is stable at a high temperature is preferably used as the refractory metal oxide layer 31. In this Example, MoO$_2$ in the refractory metal oxide layer 31 was formed according to the first method described hereinbefore, an example of which comprises the steps of annealing a Mo base in oxygen atmosphere at 300° C. for 60 minutes to form $MoO_3$ on the surface of the remaining Mo base and then annealing in nitrogen atmosphere at 800° C. for 30 minutes to form $MoO_2$ having a thickness of about 400 Å on the remaining Mo base.

The relationship between $MoO_3$ thickness and oxidation time is as illustrated in FIG. 3.

Figure 22D:
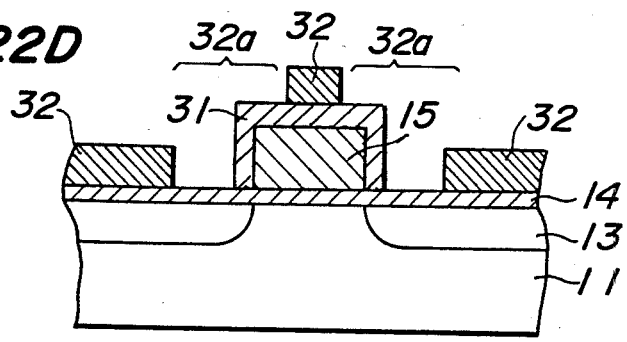

Subsequently, a resist pattern 32 as shown in FIG. 22D is formed on the structure of FIG. 22C by a known photolithographic technique. The resist pattern 32 has openings 32a for forming the contact holes 17, for example, as is shown in FIG. 22D. It is preferable that the openings 32a are so formed as to partially overlap the gate electrode 15 as is shown in FIG. 22D.

According to a conventional MISFET fabrication process, the use of a resist pattern having openings such as the openings 32a formed as described just above causes short circuit between an exposed gate electrode 15 and an electrode for contact, so that the openings 32a must be formed remote from the gate electrode 15 to provide a sufficient distance therebetween, which is usually set to be at least 1 μm with considering a tolerance in the photolithographic step, an amount of side etching in the etching step, and the like.

Figure 22E:
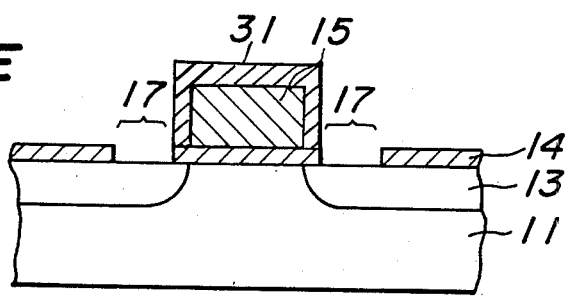

In contrast, according to the process of this invention, a resist pattern having openings 32a so formed as to partially overlap the gate electrode 15 can advantageously be employed, since the gate electrode 15 and a silicon layer 33, which will be illustrated in FIG. 22F later, are isolated from each other by forming the inner $SiO_2$ layer 16 therebetween after the formation of the silicon layer 33 connected to the substrate 11 as will be described later with reference to FIG. 22G.

Subsequently, the contact holes 17 are formed in the gate oxide layer 14, while using the resist pattern 32 as the mask, by a known etching technique. Then, the resist pattern 32, is removed to obtain a structure shown in FIG. 22E.

Subsequently, the silicon layer 33 is formed on the structure shown in FIG. 22E. The silicon layer 33 may be made of either poly Si or amorphous silicon. In this Example, the silicon layer 33 was a poly Si layer having a thickness of 3,500 Å, formed by electron beam deposition. Ion implantation of an impurity such as arsenic into the silicon layer 33 is carried out in order to reduce a resistivity of poly Si. The deposition of poly Si to form the silicon layer 33 may alternatively be performed by other method such as CVD method, and may accompany simultaneous addition of an impurity. The impurity concentration of the deposited poly Si layer may be chosen according to a usage of poly Si.

Figure 22F:
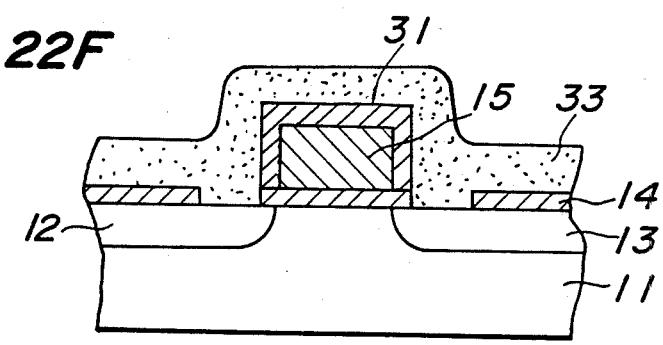
Figure 22G:
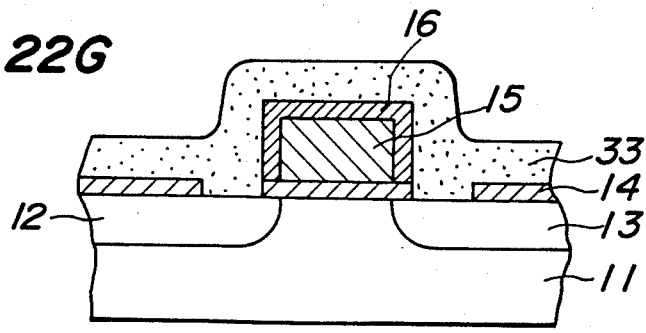

Subsequently, the structure shown in FIG. 22F is annealed in an atmosphere of a hydrogen gas or an inert gas (e.g., a nitrogen gas) mixed with a hydrogen gas to reduce the refractory metal oxide layer 31 and at the same time to internally oxidize the silicon layer 33 from the side of the refractory metal layer. In this manner, the inner $SiO_2$ layer 16 is formed to obtain a structure shown in FIG. 22G. In this Example, the reduction of $MoO_2$ into Mo was carried out by annealing the structure shown in FIG. 22F in hydrogen atmosphere at 1,000° C. for 60 minutes, while at the same time an $SiO_2$ film was formed as the inner $SiO_2$ layer 16, the thickness of which was about 700 Å. The annealing conditions, which was 1,000° C. in temperature and 60 minutes in time in this example, are sufficient, as far as the refractory metal oxide layer 31 is reduced in the interface portion thereof with the silicon layer 33 and at the same time the silicon layer 33 is internally oxidized. In this sense, the annealing temperature may be as low as 800° C. in some cases, if the above annealing conditions are satisfied. If phosphine ($PH_3$) is added to the annealing atmosphere, the inner $SiO_2$ layer 16 can be vitrified into phosphorus glass.

Thereafter, a part of the silicon layer 33 over the gate electrode 15 is removed by known photolithographic and etching techniques. The remaining two parts of the silicon layer 33 can serve as the source electrode 18 and the drain electrode 19 in the MISFET structure shown in FIG. 18. An insulating layer made, for example, of an $SiO_2$ layer, which may be formed by oxidizing the silicon layer 33, may be provided in the area of a gap between the source electrode 18 and the drain electrode 19, if desired.

An insulating interlayer, a wiring layer or the like, may be formed, if desired.

The intrastructural change by $MoO_2$ reduction and internal Si oxidation was just the same as comparatively illustrated in FIGS. 4A and 4B illustrating the depth profiles examined by Auger electron spectroscopy analysis.

The mechanism of the inner $SiO_2$ layer formation by the annealing process in hydrogen atmosphere is considered to be just the same as described with reference to FIGS. 4A and 4B.

As described above, according to the process of this invention, the silicon layer 33 and the gate electrode 15 can be isolated from each other after the formation of the silicon layer 33, so that the resist pattern can be so formed as to provide therein openings 32a for forming the contact holes 17 which partially overlap the gate electrode 15. Accordingly, the contact holes 17 can be provided in self-alignment with the gate electrode 15 via the inner $SiO_2$ layer 16. As a result, the gate electrode 15 and the contact holes 17 are very closely positioned from each other only via the thin inner $SiO_2$ layer arranged therebetween. Accordingly, the resulting semiconductor device can reduce its area and hence is well suited for a higher density fabrication of integrated circuits. For example, according to the process of this invention, the distance between the gate electrode and the contact hole can be so shortened as to be smaller by the order of one figure or more than that in a conventional structure, thereby contributing to a reduction of cell area by approximately 10%. Furthermore, the distance between the gate region under the gate electrode 15 and the contact hole 17 is uniquely determined by the thickness y of the inner $SiO_2$ layer 16. The distance is short so that a high speed semiconductor device can be obtained.

As described hereinbefore, the quality of the inner $SiO_2$ layer is substantially the same as that of an ordinary thermal-oxidation $SiO_2$ film and superior to CVD $SiO_2$ film in respect of quality. Therefore, according to the process of this invention, a semiconductor device is fabricated with excellent insulation characteristics between a gate electrode and a silicon layer used as another electrode.

Moreover, the inner $SiO_2$ layer 16 is formed by means of $H_2O$ generated during the course of reduction of the refractory metal oxide layer which is homogeneously and uniformly formed on the surface of the refractory metal layer, so that the layer 16 uniformly and selectively covers only the surface of the refractory metal layer. Therefore, short circuit hardly occurs between the gate electrode 15 and the source electrode 18 or between the gate electrode 15 and the drain electrode 19. In addition, the inner $SiO_2$ layer 16 is formed without overhanging on the surfaces of the step portions of the gate electrode 15, so that the silicon layer 33 is not disconnected on the above-mentioned step portions. Thus, substantially no occurrence of either the short circuit or the disconnection as mentioned above leads to a quite high yield of products.

Further, the inner $SiO_2$ layer 16 is easily formed on the gate electrode 15 without involving any complicated and time-consuming procedures, which are required in a conventional CVD $SiO_2$ film formation on a Mo base in order to avoid $MoO_3$ formation.

$MoO_2$ which may constitute the refractory metal oxide layer 31 is relatively resistant to acid washing, which, therefore, can be carried out after the step of forming the structure of FIG. 22D and before the step of forming the structure of FIG. 22E to cleanse the surface of the element. This aids not only the improvement of product yield but also the prevention of environmental contamination when using the fabrication apparatus.

EXAMPLE 15

The process of this invention is not limited to the procedures in Example 14 as illustrated with reference to FIGS. 22A to 22G in sequence, and has broad modifications and variations.

Figure 23A:
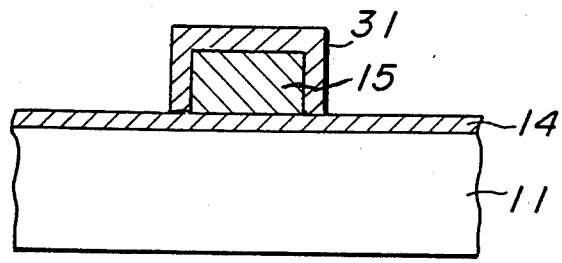
Figure 23B:
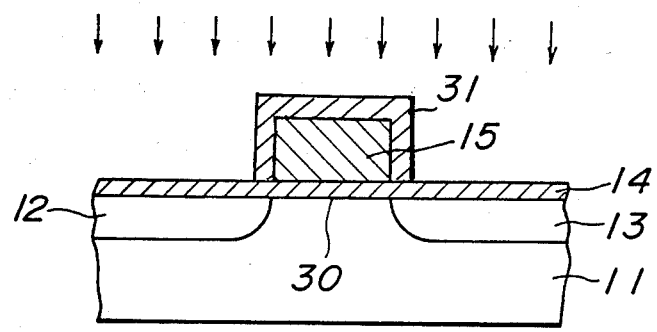

In the first modification, the ion implantation step and the refractory metal oxide layer formation step in the process of Example 14 are carried out in a reversed order. More specifically, the structure of FIG. 22A is first subjected to the refractory metal oxide layer formation step to obtain a structure shown in FIG. 23A having the refractory metal oxide layer 31, and then an impurity is ion-implanted to obtain a structure shown in FIG. 23B. Thereafter, the same procedures as used for obtaining the structures shown in FIGS. 22D to 22G sequentially follow to obtain the structure shown in FIG. 18.

According to this modification, the poor-crystallinity refractory metal oxide layer 31 first formed on the refractory metal layer to be used as the gate electrode 15 serves efficiently to prevent ion implantation from advancing thereinto, so that channelling effect can be effectively improved. This is especially advantageous for the case where a better crystallinity film or a thinner film having a thickness of 2,000 Å or less, made of, e.g., Mo is desired.

EXAMPLE 16

In the second modification of the procedures in Example 14, the refractory metal oxide layer formation step and the contact hole formation step are carried out in a reversed order. More specifically, the structure shown in FIG. 22B is subjected to the same procedures as used for obtaining the structures shown in FIGS. 22D and 22E in sequence so as to obtain structures shown in FIGS. 24A and 24B, sequentially. The structure shown in FIG. 24B is then subjected to the refractory metal oxide layer formation step to obtain a structure shown in FIG. 24C having a refractory metal oxide layer 31.

During the course of refractory metal oxide layer formation, a portion of the substrate 11 which is exposed through the contact holes 17 is partially oxidized. However, since the oxidation temperature in this case may be as low as 300° C., an $SiO_2$ layer formed in the exposed area of the substrate 11 is substantially the same in thickness as native oxide layer of Si. Consequently, such an $SiO_2$ layer can be removed by light etching with dilute fluoric acid without substantial decrease in the thickness of the gate oxide layer 14 and thus the structure shown in FIG. 24C is obtained. Additionally stated, $MoO_2$ is sufficiently resistant to dilute fluoric acid.

Subsequently, the same procedures as used for obtaining the structures shown in FIGS. 22F and 22G follow in sequence to obtain the same structure as that shown in FIG. 18.

In the processes as described hereinbefore, if the poly Si layer used as the silicon layer 33 is thin (e.g., 1,500 Å thickness), difficulties are encountered in forming a relatively thick inner $SiO_2$ layer at the interface between Mo and poly Si. It is assumed that the reason is that the thin silicon layer 33 allows $H_2O$ generated during the course of formation of the inner $SiO_2$ layer to easily escape through the pinholes and grain boundaries in the thin silicon layer 33. In order to obviate such defect, an $SiO_2$ film 34 is formed on the surface of the silicon layer 33 after the structure shown in FIG. 22F is obtained to form a structure shown in FIG. 25A. Subsequently, the same procedure as used for obtaining the structure of FIG. 22G is used to form a structure shown in FIG. 25B. Then, the $SiO_2$ film 34 may either be used as such or removed according to need.

Figure 25A:
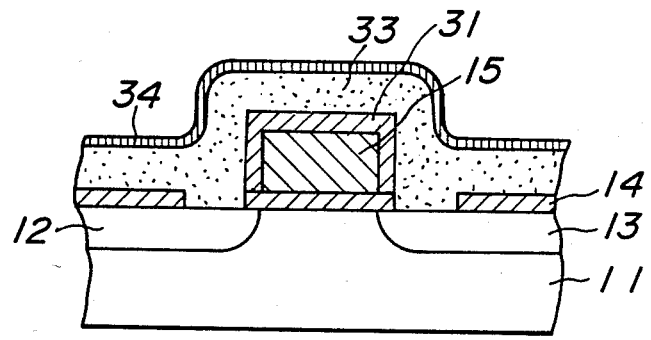
Figure 25B:
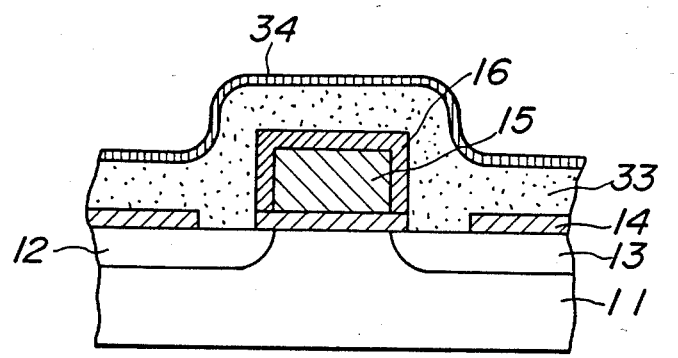

A comparison in depth profile obtained according to Auger electron spectroscopy analysis was made between the structure obtained by forming an inner $SiO_2$ layer in a precursor structure, without the $SiO_2$ layer 34, of the structure shown in FIG. 25A and the structure obtained by forming an inner $SiO_2$ layer in the structure shown in FIG. 25A having the $SiO_2$ layer 34. Here, the silicon layer 33 was formed by a poly Si layer having a thickness of 1,100 Å by electron beam deposition method, and the $SiO_2$ layer 34 of 400 Å in thickness was formed by thermally-oxidized the silicon layer 33 in the surface portion thereof.

The resultant depth profiles were just the same as illustrated in FIGS. 17A and 17B. The same conclusion as derived from the comparison between FIGS. 17A and 17B is also applicable to the above-mentioned case.

Irrespective of the thickness of the silicon layer 33 of poly Si, the $SiO_2$ layer formed on the surface of poly Si provides better controllability of inner $SiO_2$ layer formation, since various influences of poly Si itself on the film quality and the like of the inner $SiO_2$ layer being formed disappear.

Other countermeasures for obviating the defect due to the thin silicon layer 33 utilize the favorable effects of making the surface of the silicon layer 33 amorphous, or covering the silicon layer 33 with a dense film. More specifically, a film of CVD $SiO_2$ or a silicon nitride may be deposited on the surface of the silicon layer 33. Alternatively, the surface portion of the silicon layer 33 may be directly nitrided.

As described hereinbefore, when $MoO_3$ is used as the refractory metal oxide layer 31, unfavorable peeling or the like of $MoO_3$ is likely to occur in the later annealing step. In view of this, care must be given to the conditions of the thermal-oxidation formation of the $SiO_2$ layer 34 on the poly Si layer so as not to allow oxygen to diffuse into the refractory metal oxide layer 31 of $MoO_2$ through pinholes and poor crystallinity regions of the silicon layer 33, which results in the unfavorable formation of MoO$_3$. In this sense, CVD or sputtering method is more advantageous than thermaloxidation method as a method of forming an SiO$_2$ layer on the surface of poly Si, since the former method can be processed at a lower temperature without any influences upon a quality of the silicon layer 33 of poly Si.

EXAMPLE 17

In Example 16, explanation has been given to the process for producing the semiconductor device having two contact holes per one gate electrode. In this Example, the process of this invention will be explained as regards the semiconductor device shown in FIG. 19 having one contact hole per one gate electrode with reference to FIGS. 26A to 26G.

Figure 26A:
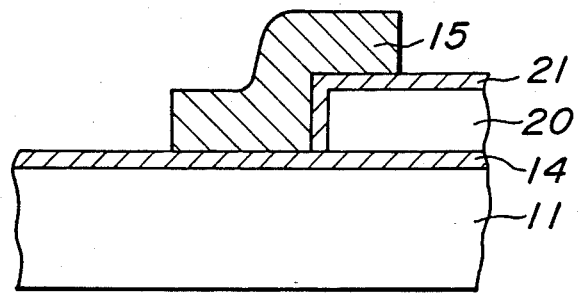
FIGS. 26A to 26G, FIGS. 27A to 27G, and FIGS. 28A to 28F are three sets of cross-sectional views showing structures obtained in the respective steps of the processes which are given for illustrating the processes of manufacturing the semiconductor devices shown in FIGS. 19, 20 and 21, respectively.
Figure 26B:
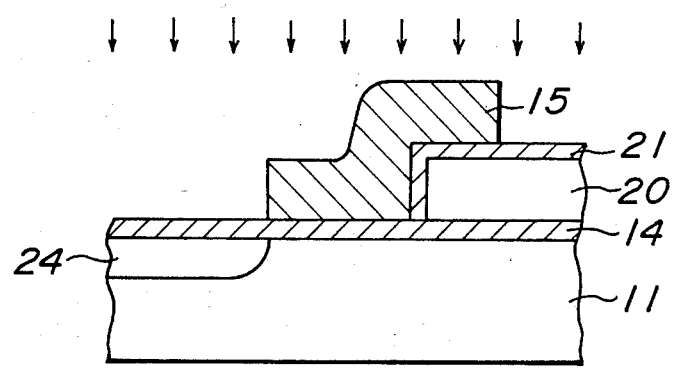
Figure 26C:
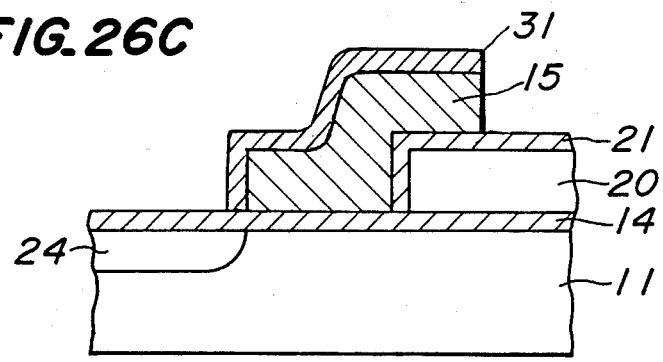
Figure 26D:
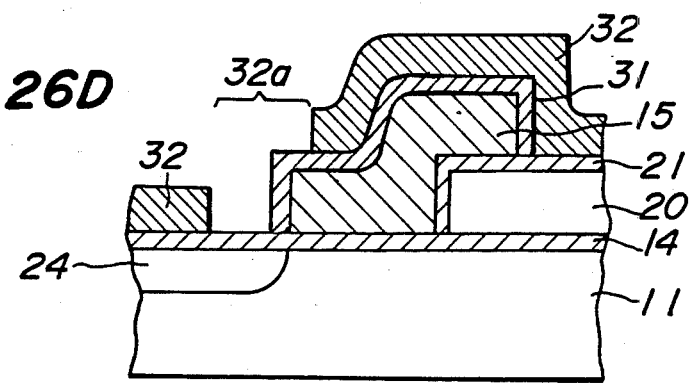
Figure 26E:
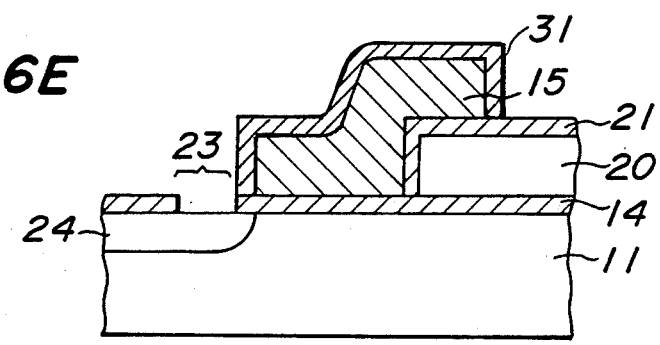
Figure 26F:
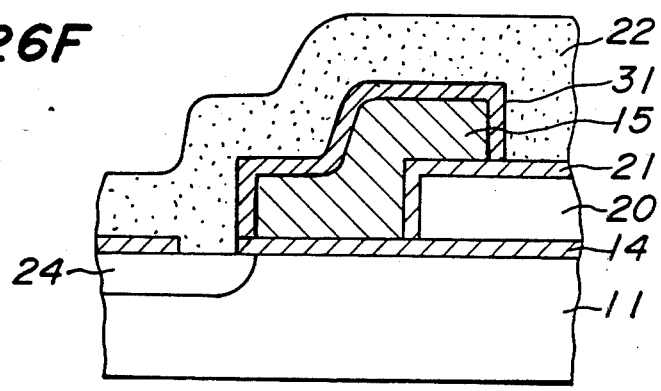
Figure 26G:
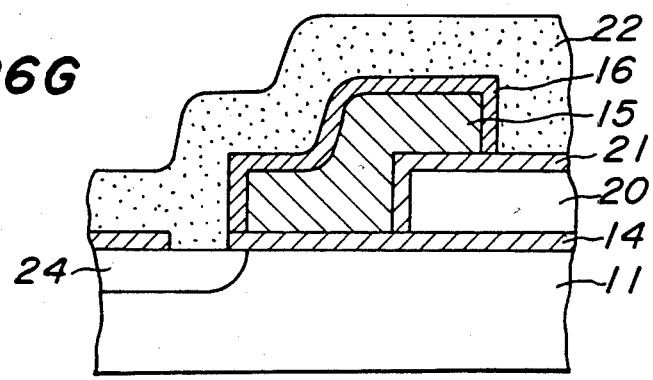

Poly Si, which will form the cell plate electrode 20, is applied onto the substrate 11 of p-type single crystal silicon via the gate oxide layer 14 interposed therebetween. The poly Si layer is so processed as to form an insulating layer such as the SiO$_2$ layer 21 on the poly Si layer. A refractory metal layer is so formed as to cover both the gate oxide layer 14 and the SiO$_2$ layer 21. The refractory metal layer is so processed to have a desired pattern in a manner that the patterned refractory metal layer covers the step portion of the cell plate electrode 20. As a result, a structure shown in FIG. 26A is obtained. The structure shown in FIG. 26A is subjected to substantially the same procedures as used for obtaining the structures shown in FIGS. 22B to 22G in sequence to obtain structures shown in FIGS. 26B to 26G, respectively, in sequence. This Example differs from Example 14 only in that only one ion implantation impurity region 24 is formed in the substrate (FIG. 26B), and hence only one contact hole is formed per one gate electrode 15 in this Example. Then, if desired, the silicon layer 22 in the structure shown in FIG. 26G is processed to form the structure shown in FIG. 19.

EXAMPLE 18

The process for manufacturing the semiconductor device shown in FIG. 20 having one contact hole per one gate electrode according to the present invention will be explained with reference to FIGS. 27A to 27G.

Figure 27A:
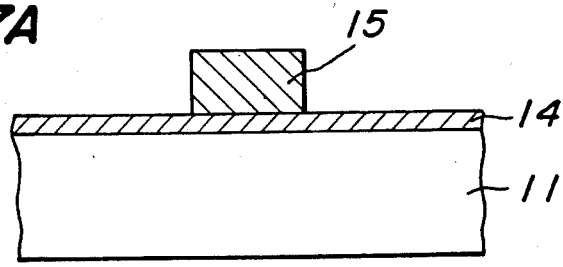
Figure 27B:
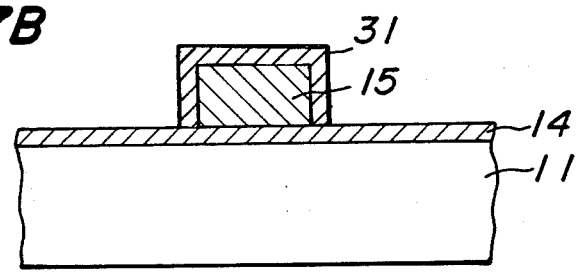
Figure 27C:
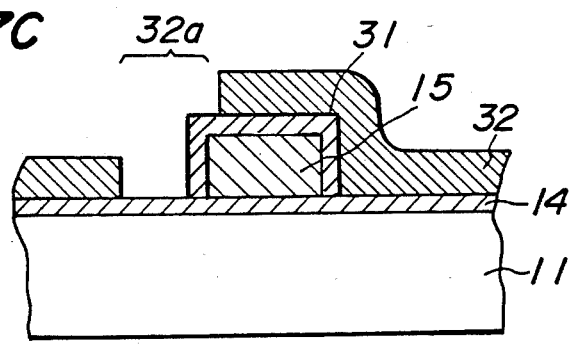
Figure 27D:
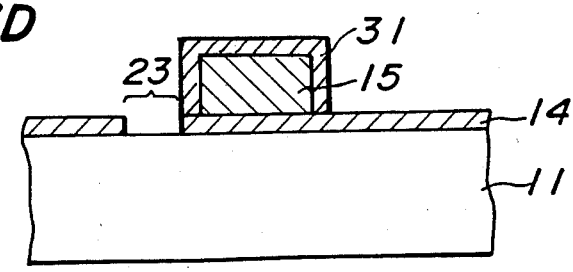

A structure shown in FIG. 27A, which is the same as that shown in FIG. 22A, is subjected to the same procedure of forming the refractory metal oxide layer as used for obtaining the structure shown in FIG. 22C, so that a structure shown in FIG. 27B is obtained. This resultant structure is subsequently subjected to substantially the same procedures as used for obtaining the structures shown in FIGS. 22D to 22F in sequence to obtain structures shown in FIGS. 27C to 27E, respectively, in sequence. The only difference between Example 14 and this Example is that one contact hole 23 is formed per one gate electrode 15 in this Example.

Figure 27E:
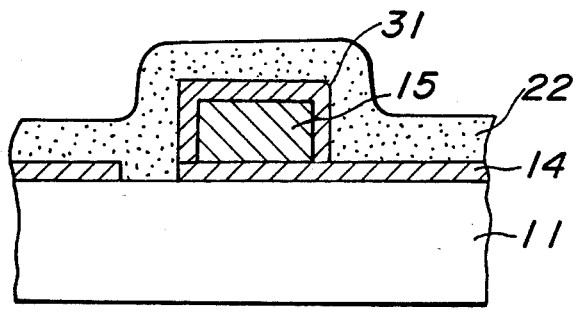
Figure 27F:
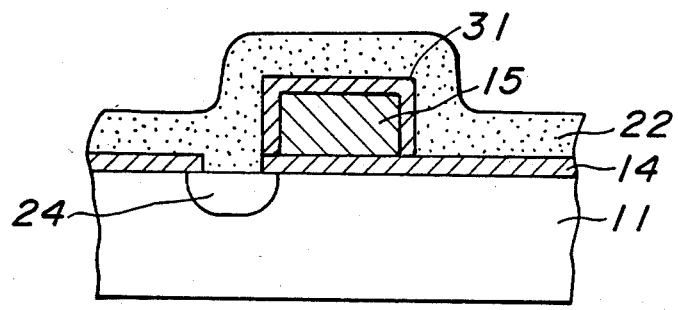

Subsequently, the structure shown in FIG. 27E is annealed in an inert gas atmosphere of, for example, nitrogen to cause an impurity in the silicon layer 22 to diffuse into the substrate 11. As a result, a structure shown in FIG. 27F having an impurity-concentrated region 24 in the substrate 11, is obtained. The structure shown in FIG. 27F is subjected to the same procedures as used for obtaining the structures shown in FIGS. 22G and 18, so that a structure shown in FIG. 27G and finally the structure shown in FIG. 20 are obtained, respectively. A part of the silicon layer 22 is used as the cell plate electrode 25.

Figure 27G:
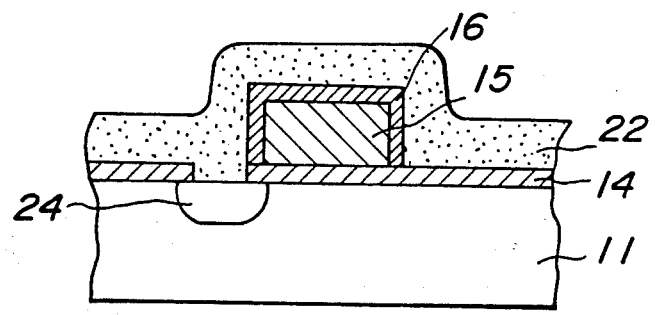

Alternatively, the step of forming the structure shown in FIG. 27F and the order of the steps of forming the structure shown in FIG. 27G may be reversed.

EXAMPLE 19

The process of manufacturing the semiconductor device shown in FIG. 21 having one contact hole per one gate electrode and one contact hole per one cell plate electrode according to the present invention will be explained with reference to FIGS. 28A to 28F.

Figure 28A:
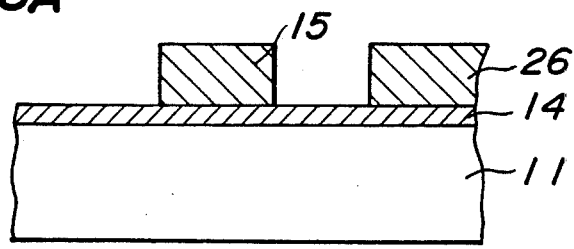
Figure 28B:
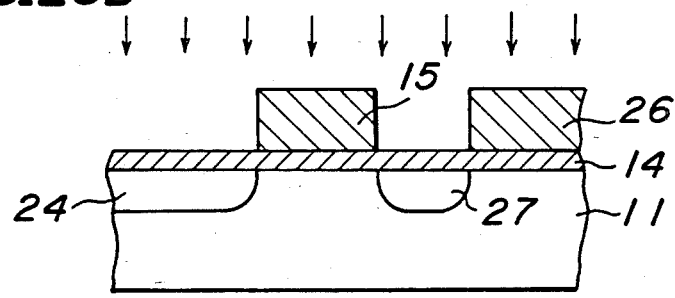
Figure 28C:
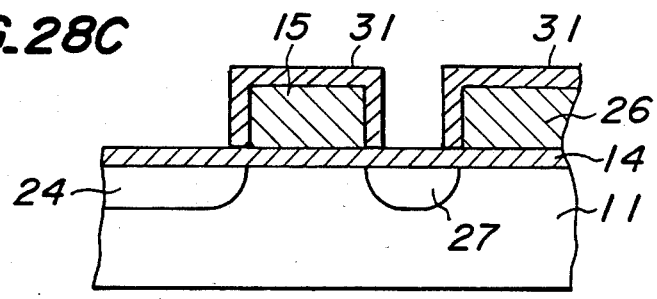
Figure 28D:
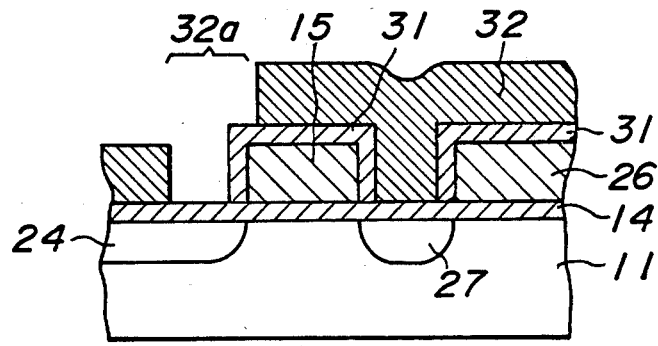
Figure 28E:
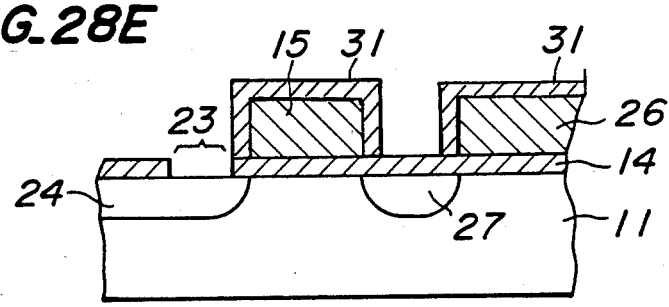
Figure 28F:
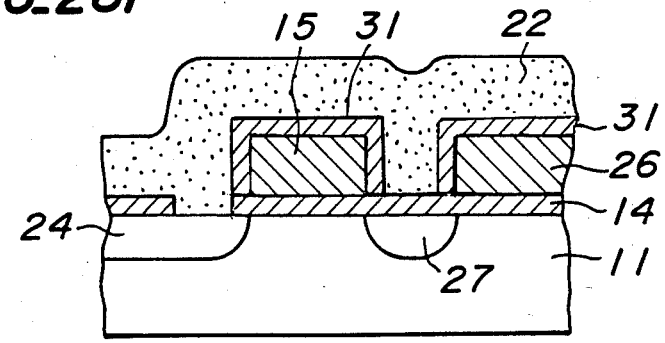

A refractory metal layer is formed on the substrate 11 with a gate oxide layer 14 arranged therebetween, and processed to obtain a structure shown in FIG. 28A having the gate electrode 15 and the cell plate electrode 26 on the substrate 11 with the gate oxide layer 14 interposed therebetween. The structure shown in FIG. 28A is subjected to substantially the same procedures as used for obtaining the structures shown in FIGS. 22B to 22G in sequence, so that structures shown in FIGS. 28B to 28F and 21 are obtained, respectively, in sequence.

This Example is different from Example 14 only in that the contact hole 23 is formed only around the end of the gate electrode 15 opposite the other end of the gate electrode 15 confronting the cell plate electrode 26, so that the silicon layer 22 is connected to one impurity region 24 by way of the contact hole 23. Subsequently, if desired, the silicon layer 22 may further be processed or patterned.

The process of Example 17 described with reference to FIGS. 26A to 26G and 19, and the process of Example 19 described with reference to FIGS. 28A to 28F and 21 can also be modified corresponding to those described with reference to FIGS. 23A and 23B, FIGS. 24A to 24C, and FIGS. 25A and 25B. The process of Example 18 described with reference to FIGS. 27A to 27G and 20 can also be modified corresponding to those described with reference to FIGS. 24A to 24C, and FIGS. 25A and 25B.

The process of the present invention is not limited to the preferred embodiments as mentioned hereinbefore. For example, the following variations still fall within the scope of the invention. That is, only a part of MoO$_2$ in the refractory metal oxide layer may be reduced in the annealing step under an atmosphere comprising hydrogen, while at the same time the silicon layer on the refractory metal oxide layer is oxidized at the interface portion to form an inner SiO$_2$ layer. An n-type single crystal silicon substrate may be employed as the substrate 11, and a p-type impurity is introduced to provide the regions 12 and 13, or the regions 24 and 27. Various combinations of substrate and impurity are possible in accordance with a desired semiconductor device.

As described with respect to the procedure for obtaining the structure shown in FIG. 27F, impurity introduction into the substrate 11 for providing the region 12, 13 or 24 may be effected by diffusing impurity from the silicon layer 18, 19, 22 or 33 into the substrate 11. The silicon layer alone isolated by the inner SiO$_2$ layer from the refractory metal layer may be removed and replaced with other conductive layer having a lower resistivity.

While the foregoing explanations have been mainly made with respect to the embodiments of MISFET, the process according to this invention is never limited to those embodiments of MISFET, and can be widely applicable to semiconductor devices in which electrode wirings themselves, or electrode wirings and contact holes are required to be formed with a self-alignment relationship with each other.

The foregoing description of the preferred embodiments has been mainly made with reference to the case where Mo is used as the refractory metal. Any kind of refractory metal may be used in the present invention, so far as the metal can be reduced by annealing in an atmosphere containing hydrogen. In this sense, it will be easily understood that most of refractory metals can be employed in the present invention. In the case of a semiconductor device fabrication process which does not involve any procedure to be carried out at a high temperature, metal having a melting point lower than those of refractory metals may be used instead, so far as it is reducible in an atmosphere containing hydrogen.

As described above, according to the present invention, an inner $SiO_2$ layer is selectively formed only on the surface of a refractory metal layer and has substantially the same quality as the ordinary thermal-oxidation $SiO_2$ layer. In connection with this advantage, the following various advantages are achieved.

(1) The gate electrode and the contact hole can be provided in self-alignment with each other via the inner $SiO_2$ layer interposed therebetween, so that a semiconductor device preferable for a high density fabrication of integrated circuits is obtained.

(2) The distance between the gate electrode and the contact hole is determined only by a thickness of the thin inner $SiO_2$ layer, so that a high speed semiconductor device is realized.

(3) The inner $SiO_2$ layer has excellent insulating properties, so that a semiconductor device having excellent insulation characteristics between the gate electrode and the silicon layer is obtained.

(4) The inner $SiO_2$ layer is formed, after the gate electrode is covered by the silicon layer, by the uniform oxidation of the silicon layer in the interface portion thereof with the refractory metal layer, so that a semiconductor device without either short circuit between the gate electrode and the silicon layer and disconnection of the silicon layer is manufactured with a high yield.

(5) The inner $SiO_2$ layer has excellent insulating properties, so that a semiconductor device with excellent characteristics of insulation between the refractory metal layer and the silicon layer is manufactured with simple and easy steps.

(6) The inner $SiO_2$ layer is homogeneously and uniformly formed without overhanging, even if the refractory metal layer has a step portion, so that a semiconductor device with few short circuits or disconnection is manufactured with a high yield.

(7) If the inner $SiO_2$ layer is used as an insulating interlayer between the silicon layer and the refractory metal layer and both the silicon layer and the refractory metal layer are used as wirings, a multilayer wiring structure is simply manufactured.

(8) The inner $SiO_2$ layer has excellent insulating properties, even if the inner $SiO_2$ layer is thin, so that the thickness of the insulating layer covering the side step-like wall of the refractory metal layer can be reduced, thereby contributing to a high density fabrication of semiconductor devices.

(9) The inner $SiO_2$ layer or the refractory metal oxide layer is resistant to acid washing, so that an element surface can be easily cleansed by acid washing in the course of the process, in case that the process involves the exposure of the inner $SiO_2$ layer and/or the refractory metal oxide layer in any intermediate step. As a result, a product yield is improved and contamination is reduced when using the fabrication apparatus.

What is claimed is:

1. A process for manufacturing a semiconductor device, comprising the steps of:
   (1) applying a refractory metal layer onto a base;
   (2) forming a refractory metal oxide layer on the surface of said refractory metal layer;
   (3) forming a silicon layer on said refractory metal oxide layer; and
   (4) annealing the resulting structure in an atmosphere containing hydrogen to form an internally oxidized silicon layer substantially at the interfaces of said refractory metal layer and said silicon layer.

2. A process as claimed in claim 1, wherein said step (2) comprises at least the sub-steps of:
   (2-1) oxidizing the surface portion of said refractory metal layer in a low temperature atmosphere containing oxygen; and
   (2-2) annealing the resulting product in an inert gas atmosphere at a high temperature so as to form said refractory metal oxide layer.

3. A process as claimed in claim 1, wherein said step (2) comprises the sub-step of oxidizing the surface portion of said refractory metal layer in an atmosphere of an inert gas mixed with oxygen.

4. A process as claimed in claim 1, which further comprises the step of forming a silicon dioxide layer on the surface of said silicon layer between said steps (3) and (4).

5. A process as claimed in claim 1, wherein said base comprises a substrate and an insulating layer thereon, and said refractory metal layer has a predetermined pattern formed on said substrate via said insulating layer interposed therebetween, which further comprises the step of forming at least one contact hole in said insulating layer in self-alignment with at least one edge of the shaped refractory metal layer via said refractory metal oxide layer interposed therebetween, between said steps (2) and (3), and wherein said silicon layer in said step (3) is so formed as to cover said at least one contact hole and said refractory metal layer.

6. A process as claimed in claim 5, which further comprises the step of forming a silicon dioxide layer on the surface of said layer of silicon between said steps (3) and (4).

7. A process as claimed in claim 1, wherein said base comprises a substrate and an insulating layer thereon, and said refractory metal layer has a predetermined shape formed on said substrate via said insulating layer interposed therebetween, which further comprises the step of forming at least one contact hole in said insulating layer in self-alignment with at least one edge of the shaped refractory metal layer via said refractory metal layer interposed therebetween, between said steps of (1) and (2), and wherein said silicon layer in said step (3) is so formed as to cover said at least one contact hole and said refractory metal layer.

8. A process as claimed in claim 7, which further comprises the step of forming a silicon dioxide layer on the surface of said silicon layer between said steps (3) and (4).

* * * * *